(12) United States Patent (10) Patent No.: US 7,535,817 B2
Kley (45) Date of Patent: *May 19, 2009

(54) NANOMETER SCALE DATA STORAGE DEVICE AND ASSOCIATED POSITIONING SYSTEM

(75) Inventor: Victor B. Kley, Berkeley, CA (US)

(73) Assignee: General Nanotechnology, L.L.C., Berkeley, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 11/325,248

(22) Filed: Jan. 3, 2006

(65) Prior Publication Data

US 2006/0239129 A1 Oct. 26, 2006

Related U.S. Application Data

(60) Continuation of application No. 10/630,350, filed on Jul. 29, 2003, now Pat. No. 7,042,828, which is a continuation of application No. 08/955,031, filed on Oct. 21, 1997, now Pat. No. 6,724,712, which is a division of application No. 08/506,516, filed on Jul. 24, 1995, now Pat. No. 5,751,683.

(51) Int. Cl.
*G11B 7/00* (2006.01)
(52) U.S. Cl. .................................................. 369/126
(58) Field of Classification Search .................. 369/126
See application file for complete search history.

(56) References Cited

U.S. PATENT DOCUMENTS 3,586,865 A 6/1971 Baker et al.
3,812,288 A 5/1974 Walsh et al.
4,115,806 A 9/1978 Morton
4,604,520 A 8/1986 Pohl (Continued)

FOREIGN PATENT DOCUMENTS

EP 0325056 7/1989

(Continued)

OTHER PUBLICATIONS

U.S. Appl. No. 12/214,573, filed Jun. 19, 2008, Kley.

(Continued)

*Primary Examiner*—Nabil Z Hindi
(74) *Attorney, Agent, or Firm*—Townsend and Townsend and Crew LLP

(57) ABSTRACT

A data storage system that includes a positioning system for positioning the write/read mechanism and the storage medium of the data storage device with respect to each other in first and second predefined directions. The positioning system comprises a positioning apparatus comprising microfabricated first and second positioning assemblies. The positioning system further comprises a controller to position a positionable support structure of the first positioning assembly in a first predefined direction within a range of positioning that is larger than the range of movement of a moveable support structure of the first positioning assembly by controlling (A) a stationary support structure clamp in clamping and unclamping the positionable structure to and from the support structure, (B) a moveable structure clamp in clamping and unclamping the positionable support structure to and from the moveable support structure, and (C) the movement of the moveable support structure.

11 Claims, 20 Drawing Sheets

U.S. PATENT DOCUMENTS

| | | | |
|---|---|---|---|
| 4,672,559 A | 6/1987 | Jansson et al. | |
| 4,673,477 A | 6/1987 | Ramalingram et al. | |
| RE32,457 E | 7/1987 | Matey | |
| 4,681,451 A | 7/1987 | Guerra et al. | |
| 4,697,594 A | 10/1987 | Mayo, Jr. | |
| 4,793,201 A | 12/1988 | Kanai et al. | |
| 4,831,614 A | 5/1989 | Duerig | |
| 4,866,986 A | 9/1989 | Cichanski | |
| 4,907,195 A | 3/1990 | Kazan et al. | |
| 4,914,293 A | 4/1990 | Hayashi et al. | |
| 4,916,688 A * | 4/1990 | Foster et al. | 369/126 |
| 4,924,091 A | 5/1990 | Hansma et al. | |
| 4,954,704 A | 9/1990 | Elings et al. | |
| 4,999,495 A | 3/1991 | Miyata et al. | |
| 5,001,344 A | 3/1991 | Kato et al. | |
| 5,010,249 A | 4/1991 | Nishikawa | |
| 5,015,850 A | 5/1991 | Zdeblick | |
| 5,018,865 A | 5/1991 | Ferrell et al. | |
| 5,025,346 A | 6/1991 | Tang | |
| 5,038,322 A | 8/1991 | Van Loenen | |
| 5,043,577 A | 8/1991 | Pohl | |
| 5,047,633 A | 9/1991 | Finlan et al. | |
| 5,047,649 A | 9/1991 | Hodgson et al. | |
| 5,072,116 A | 12/1991 | Kawade et al. | |
| 5,081,390 A | 1/1992 | Elings et al. | |
| 5,105,305 A | 4/1992 | Betzig et al. | |
| 5,107,112 A | 4/1992 | Yanagisawa et al. | |
| 5,108,865 A | 4/1992 | Zwaldo et al. | |
| 5,118,541 A | 6/1992 | Yamamoto et al. | |
| 5,138,159 A | 8/1992 | Takase et al. | |
| 5,142,145 A | 8/1992 | Yasutake | |
| 5,148,307 A | 9/1992 | Kopelman | |
| 5,148,308 A | 9/1992 | Miyauchi | |
| 5,155,589 A | 10/1992 | Gere | |
| 5,166,520 A | 11/1992 | Prater et al. | |
| 5,168,520 A | 12/1992 | Weiss | |
| 5,187,367 A | 2/1993 | Miyazaki | |
| 5,196,701 A * | 3/1993 | Foster et al. | 250/306 |
| RE34,214 E | 4/1993 | Carlsson et al. | |
| 5,210,410 A | 5/1993 | Barret | |
| 5,216,631 A | 6/1993 | Sliwa | |
| 5,220,555 A | 6/1993 | Yanagisawa | |
| 5,227,626 A | 7/1993 | Okada et al. | |
| 5,231,286 A | 7/1993 | Kajimura et al. | |
| 5,241,527 A | 8/1993 | Eguchi | |
| 5,249,077 A | 9/1993 | Laronga | |
| 5,252,835 A | 10/1993 | Lieber et al. | |
| 5,253,515 A | 10/1993 | Toda et al. | |
| 5,254,209 A | 10/1993 | Schmidt et al. | |
| 5,254,854 A | 10/1993 | Betzig | |
| 5,260,824 A | 11/1993 | Okada et al. | |
| 5,276,672 A | 1/1994 | Miyazaki | |
| 5,278,704 A | 1/1994 | Matsuda | |
| 5,283,437 A | 2/1994 | Greshner et al. | |
| 5,289,004 A | 2/1994 | Okada et al. | |
| 5,289,408 A | 2/1994 | Mimura | |
| 5,297,130 A | 3/1994 | Tagawa | |
| 5,299,184 A | 3/1994 | Yamano | |
| 5,302,239 A | 4/1994 | Roe et al. | |
| 5,307,311 A | 4/1994 | Sliwa | |
| 5,308,974 A | 5/1994 | Elings et al. | |
| 5,317,152 A | 5/1994 | Takamatsu | |
| 5,317,533 A | 5/1994 | Quate | |
| 5,319,961 A | 6/1994 | Matsuyama et al. | |
| 5,319,977 A | 6/1994 | Quate et al. | |
| 5,322,735 A | 6/1994 | Fridez et al. | |
| 5,329,122 A * | 7/1994 | Sakai et al. | 250/306 |
| RE34,708 E | 8/1994 | Hansma et al. | |
| 5,338,932 A | 8/1994 | Theodore et al. | |
| 5,343,460 A | 8/1994 | Miyazaki | |
| 5,349,735 A | 9/1994 | Kawase | |
| 5,353,632 A | 10/1994 | Nakagawa | |
| 5,354,985 A | 10/1994 | Quate | |
| 5,357,109 A | 10/1994 | Kusumoto | |
| 5,357,110 A | 10/1994 | Statham | |
| 5,360,977 A | 11/1994 | Onuki et al. | |
| 5,362,963 A | 11/1994 | Kopelman et al. | |
| 5,373,494 A | 12/1994 | Kawagishi | |
| 5,389,475 A | 2/1995 | Yanagisawa | |
| 5,392,275 A | 2/1995 | Kawada et al. | |
| 5,393,647 A | 2/1995 | Neukermans et al. | |
| 5,396,483 A | 3/1995 | Matsida | |
| 5,408,094 A | 4/1995 | Kajimura | |
| 5,412,641 A | 5/1995 | Shinjo | |
| 5,414,260 A | 5/1995 | Takimoto et al. | |
| 5,414,690 A | 5/1995 | Shido et al. | |
| 5,416,331 A | 5/1995 | Ichikawa et al. | |
| 5,418,363 A | 5/1995 | Elings et al. | |
| 5,426,631 A | 6/1995 | Miyazaki et al. | |
| 5,453,970 A | 9/1995 | Rust et al. | |
| 5,455,420 A | 10/1995 | Ho et al. | |
| 5,461,605 A | 10/1995 | Takimoto | |
| 5,463,897 A | 11/1995 | Prater et al. | |
| 5,471,458 A | 11/1995 | Oguchi et al. | |
| 5,472,881 A | 12/1995 | Beebe et al. | |
| 5,489,339 A | 2/1996 | Hattori et al. | |
| 5,490,132 A | 2/1996 | Yagi et al. | |
| 5,495,109 A | 2/1996 | Lindsay et al. | |
| 5,502,306 A | 3/1996 | Meisburger et al. | |
| 5,506,829 A | 4/1996 | Yagi | |
| 5,510,615 A | 4/1996 | Ho et al. | |
| 5,519,686 A | 5/1996 | Yanagisawa et al. | |
| 5,548,117 A | 8/1996 | Nakagawa | |
| 5,559,328 A | 9/1996 | Weiss et al. | |
| 5,560,244 A | 10/1996 | Prater et al. | |
| 5,581,082 A | 12/1996 | Hansma et al. | |
| 5,583,286 A | 12/1996 | Matsuyama | |
| 5,602,820 A | 2/1997 | Wickramasinghe et al. | |
| 5,610,898 A | 3/1997 | Takimoto | |
| 5,623,476 A | 4/1997 | Eguchi | |
| 5,634,230 A | 6/1997 | Maurer | |
| 5,644,512 A | 7/1997 | Chernoff et al. | |
| 5,679,952 A | 10/1997 | Lutwyche et al. | |
| 5,717,680 A | 2/1998 | Yamano | |
| 5,721,721 A | 2/1998 | Yanagisawa | |
| 5,751,683 A | 5/1998 | Kley | |
| 5,756,997 A | 5/1998 | Kley | |
| 5,763,879 A | 6/1998 | Zimmer et al. | |
| 5,804,709 A | 9/1998 | Bougoin et al. | |
| 5,821,410 A | 10/1998 | Xiang et al. | |
| 5,825,670 A | 10/1998 | Chernoff et al. | |
| 5,865,978 A | 2/1999 | Cohen | |
| 5,874,726 A | 2/1999 | Haydon | |
| 5,883,387 A | 3/1999 | Matsuyama et al. | |
| 5,922,214 A | 7/1999 | Liu et al. | |
| 6,031,756 A | 2/2000 | Gimsewski et al. | |
| 6,031,758 A | 2/2000 | Katayama et al. | |
| 6,066,265 A | 5/2000 | Galvin et al. | |
| 6,101,164 A | 8/2000 | Kado et al. | |
| 6,144,028 A | 11/2000 | Kley | |
| 6,173,604 B1 | 1/2001 | Xiang et al. | |
| 6,199,269 B1 | 3/2001 | Greco et al. | |
| 6,201,226 B1 | 3/2001 | Shimada et al. | |
| 6,229,138 B1 | 5/2001 | Kley | |
| 6,229,607 B1 | 5/2001 | Shirai et al. | |
| 6,229,609 B1 | 5/2001 | Muramatsu et al. | |
| 6,232,597 B1 | 5/2001 | Kley | |
| 6,239,426 B1 | 5/2001 | Muramatsu et al. | |
| 6,242,734 B1 | 6/2001 | Kley | |
| 6,249,747 B1 | 6/2001 | Bennig et al. | |
| 6,252,226 B1 | 6/2001 | Kley | |
| 6,265,711 B1 | 7/2001 | Kley | |
| 6,281,491 B1 | 8/2001 | Kley | |
| 6,337,479 B1 | 1/2002 | Kley | |

| | | | |
|---|---|---|---|
| 6,339,217 B1 | 1/2002 | Kley | |
| 6,340,813 B1 | 1/2002 | Tominaga et al. | |
| 6,353,219 B1 | 3/2002 | Kley | |
| 6,369,379 B1 | 4/2002 | Kley | |
| 6,396,054 B1 | 5/2002 | Kley | |
| 6,507,553 B2 | 1/2003 | Kley | |
| 6,515,277 B1 | 2/2003 | Kley | |
| 6,517,249 B1 | 2/2003 | Doll | |
| 6,573,369 B2 | 6/2003 | Henderson et al. | |
| 6,614,227 B2 | 9/2003 | Ookubo | |
| 6,724,712 B2 | 4/2004 | Kley | |
| 6,737,331 B1 | 5/2004 | Lewis et al. | |
| 6,752,008 B1 | 6/2004 | Kley | |
| 6,787,768 B1 | 9/2004 | Kley et al. | |
| 6,802,646 B1 | 10/2004 | Kley | |
| 6,813,937 B2 | 11/2004 | Kley | |
| 6,861,648 B2 | 3/2005 | Kley | |
| 7,042,828 B2 | 5/2006 | Kley | |
| 7,045,780 B2 | 5/2006 | Kley | |
| 7,091,476 B2 | 8/2006 | Kley | |
| 7,323,699 B2 | 1/2008 | Hopkins et al. | |
| 2001/0010668 A1 | 8/2001 | Kley | |
| 2002/0007667 A1 | 1/2002 | Pohl et al. | |
| 2002/0117611 A1 | 8/2002 | Kley | |
| 2002/0135755 A1 | 9/2002 | Kley | |
| 2002/0189330 A1 | 12/2002 | Mancevski et al. | |
| 2003/0012657 A1 | 1/2003 | Marr et al. | |
| 2003/0027354 A1 | 2/2003 | Geli | |
| 2003/0062193 A1 | 4/2003 | Thaysen et al. | |
| 2003/0089182 A1 | 5/2003 | Thaysen et al. | |
| 2003/0167831 A1 | 9/2003 | Kley | |
| 2004/0118192 A1 | 6/2004 | Kley | |
| 2004/0175631 A1 | 9/2004 | Crocker et al. | |
| 2004/0213910 A1 | 10/2004 | Cai et al. | |
| 2006/0169913 A1 | 8/2006 | Hopkins et al. | |
| 2006/0237639 A1 | 10/2006 | Kley | |
| 2007/0022804 A1 | 2/2007 | Kley | |
| 2008/0121028 A1 | 5/2008 | Kley | |

FOREIGN PATENT DOCUMENTS

| | | | |
|---|---|---|---|
| EP | 376 045 A2 | 12/1989 | |
| EP | 376 045 A3 | 12/1989 | |
| EP | 427 443 A2 | 10/1990 | |
| EP | 720 050 A2 | 7/1996 | |
| EP | 720 050 A3 | 7/1996 | |
| JP | 61-133065 | 6/1986 | |
| JP | 01-235878 A | 9/1989 | |
| JP | 63-062186 | 9/1989 | |
| JP | 1-262403 | 10/1989 | |
| JP | 03-240959 A | 10/1991 | |
| JP | 04-027805 | 1/1992 | |
| JP | 04-350510 | 4/1992 | |
| JP | 04-032424 | 9/1993 | |
| JP | 05-231859 A | 9/1993 | |
| JP | 06-011335 A | 1/1994 | |
| JP | 06-074899 A | 3/1994 | |
| JP | 7-105580 | * | 4/1995 |
| WO | WO 96/03641 A1 | 2/1996 | |
| WO | WO 97/04449 | 2/1997 | |
| WO | WO 98/34092 A2 | 8/1998 | |
| WO | WO 01/03157 | 1/2001 | |
| WO | WO 03/046473 | 6/2003 | |
| WO | WO 2004/023490 | 3/2004 | |

OTHER PUBLICATIONS

U.S. Appl. No. 08/786,623, filed Jan. 21, 1997, Kley.
U.S. Appl. No. 08/827,953, filed Apr. 6, 1997, Kley.
U.S. Appl. No. 08/281,883, filed Jul. 28, 1994, Kley.
U.S. Appl. No. 08/412,380, filed Mar. 29, 1995, Kley.
U.S. Appl. No. 08/538,588, filed Oct. 3, 1995, Kley.
Ager et al., "Multilayer hard carbon films with low wear rates," *Surface and Coatings Technology*, 91:91-94 (1997).
Betzig et al "Near-Field Optics: Microscopy Spectroscopy and Surface Modification Beyond the Diffraction Limit" *Science*, 257: 189-195 (1992).
Dai et al. "Nanotubes as nanoprobes in scanning probe microscopy," *Nature*, 384:147-150 (1996).
Davis "Deposition characterization and device development in diamond silicon carbide and gallium nitride thin films" *J. Vac. Sci. Technol. A*, 11(4): 829-837, Jul./Aug. (1993).
Diaz et al., "An Improved Fabrication Technique for Porous Silicon," *Rev. Sci. Instrum.*, 64(2):507-509 (1993).
Givargizov et al "Growth of diamond particles on sharpened silicon tips" *Materials Letters*, 18:61-63 (1993).
Gomyou et al. "Effect of Electrochemical Treatments on the Photoluminescence from Porous Silicon," *J. Electrochem. Soc.*, 139(9): L86-L88 (1992).
"In Situ Sharpening of Atomic Force Microscope Tips," *IBM Technical Disclosure Bulletin*, 38(2):637 (1995).
Jaschke et al. "Deposition of Organic Material by the Tip of a Scanning Force Microscope," *Langmuir*, 11:1061-1064 (1995).
Nossarzewska-Orlowska et al., "Photoluminescence Properties of Porous Silicon Prepared by Electrochemical Etching of Si Epitaxial Layer," *Acta Physica Polonica A*, 84(4): 713-716 (1993).
Rasmussen et al. "Fabrication of an All-metal Atomic Force Microscope Probe," *IEEE* (1997).
Rossow et al., "Influence of the Formation Conditions on the Microstructure of Porous Silicon Layers Studied by Spectroscopic Ellipsometry," *Thin Solid Films*, 255:5-8 (1995).
Smestad et al., "Photovoltaic Response in Electrochemically Prepared Photoluminescent Porous Silicon," *Solar Energy Materials and Solar Cells*, 26: 277-283 (1992).
Supplementary European Search Report of Aug. 25, 2006 for European application 998904705.5.
Tang, William Chi-Keung, "Electrostatic comb drive for resonant sensor and actuator applications," Abstract of dissertation at the University of California at Berkeley (1990).
Toledo-Crow et al "Near-field differential scanning optical microscope with atomic force regulation" *Appl. Phys. Lett.*, 60(24): 2957-2959 (1992).
Van Hulst et al "Near-field optical microscope using a silicon-nitride probe" *Appl. Phys. Lett.*, 62(5): 461-463 (1993).
Watson et al "The Radiation Patterns of Dielectric Rods—Experiment Theory" *Journal of Applied Physics*, 19: 661-670 (1948).
International Search Report of Aug. 24, 1998 in PCT/US98/01528.
International Search Report of Sep. 25, 1995 in PCT/US95/09553.
International Search Report of Dec. 18, 1996 in PCT/US96/12255.
English translation of Dismissal of Amendment in related Japanese application 2004-282080.
English translation of Final Notice of Reason for Refusal in related Japanese application 2004-282080.
English translation of Notification of Reasons for Rejection in related Japanese application 2004-282080.
English translation of Notification of Reasons for Rejection in related Japanese application 08-505983.

* cited by examiner

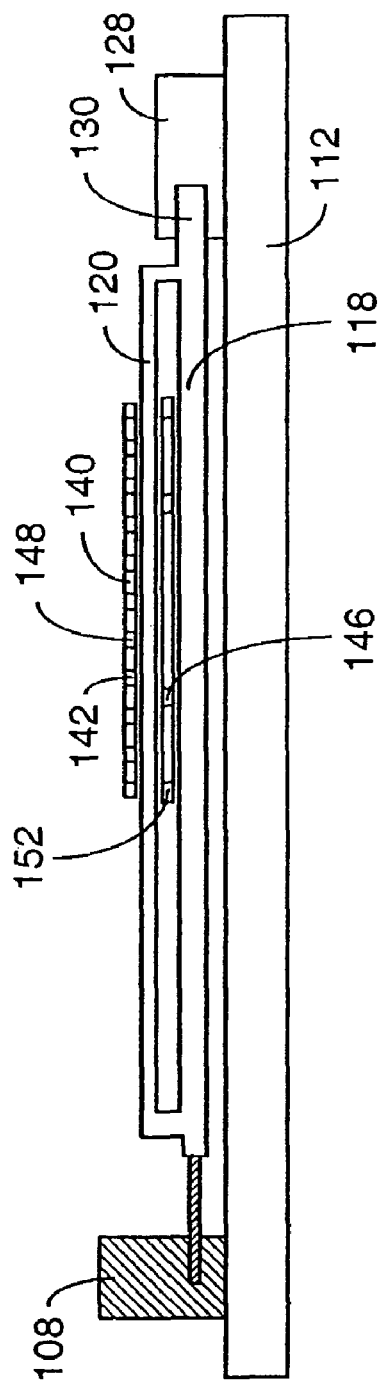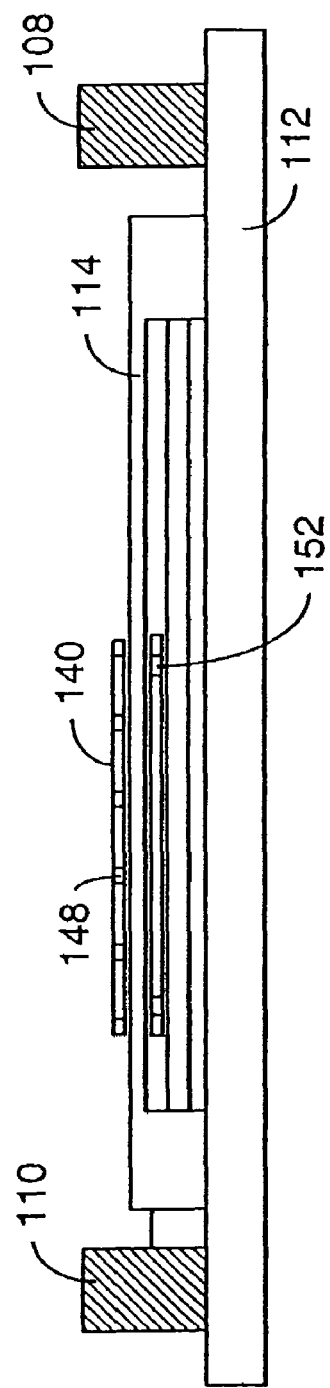

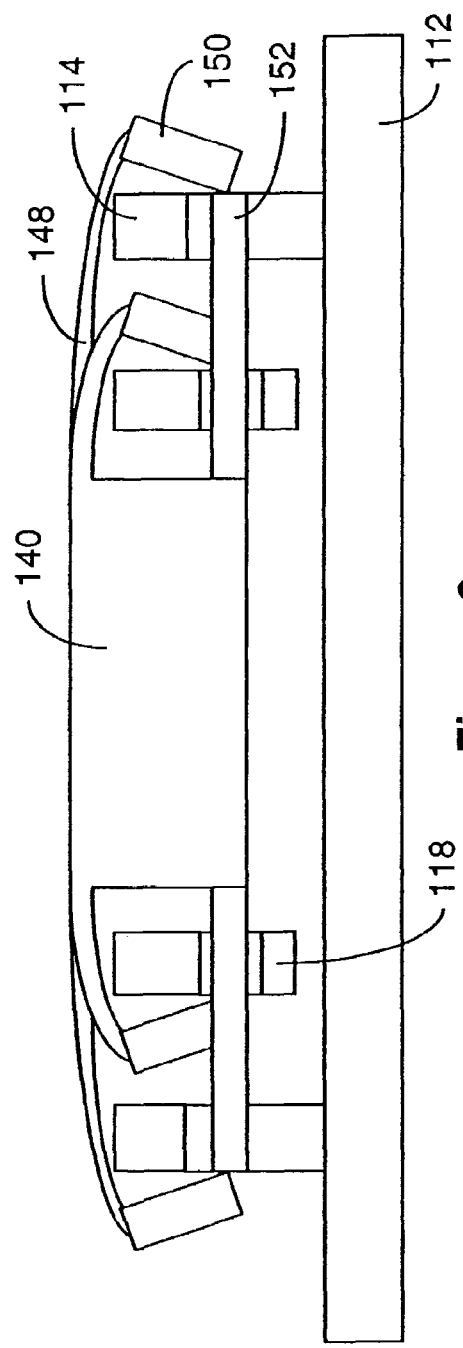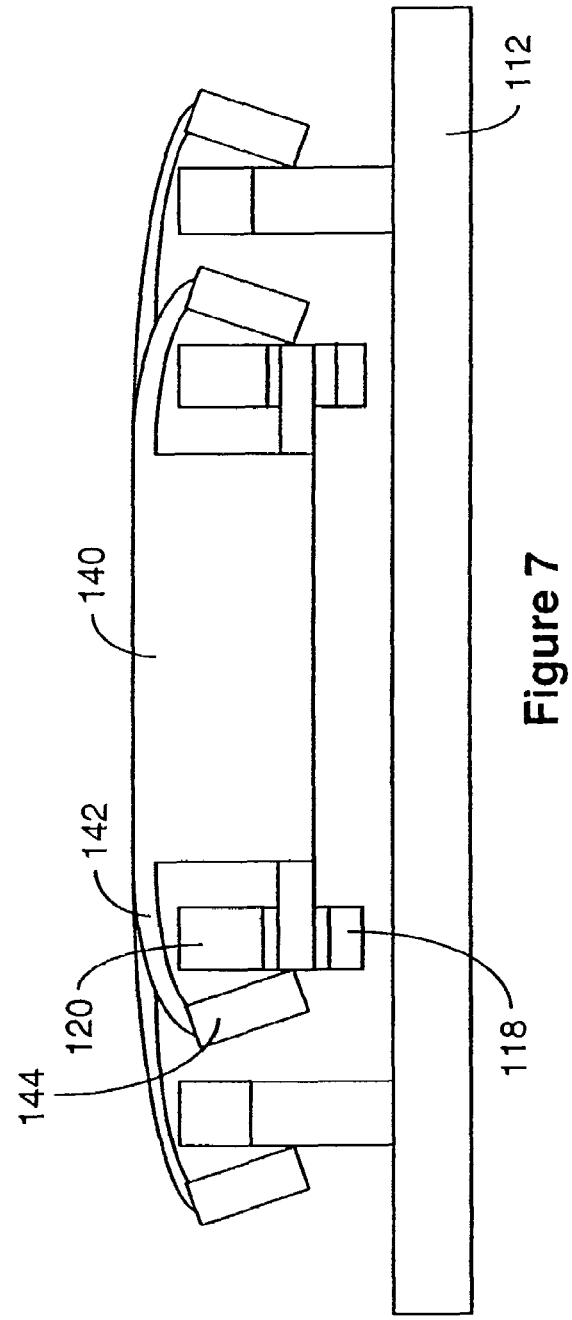

NANOMETER SCALE DATA STORAGE DEVICE AND ASSOCIATED POSITIONING SYSTEM

CROSS-REFERENCES TO RELATED APPLICATIONS

This application is a continuation of U.S. patent application Ser. No. 10/630,350, filed Jul. 29, 2003, which is a continuation of U.S. patent application Ser. No. 08/955,031, filed Oct.21, 1997, now U.S. Pat. No. 6,724,712, which is a division of U.S. patent application Ser. No. 08/506,516, filed Jul. 24, 1995, now U.S. Pat. No. 5,751,683.

FIELD OF THE INVENTION

The present invention relates generally to data storage devices and their associated positioning systems. In particular, it relates to data storage devices to store and recover data by producing optical, electrical, or mechanical changes in storage media at nanometer level (i.e., scale) increments (i.e., intervals) with microfabricated structures which are positionable at nanometer level increments with the positioning system of the data storage devices.

BACKGROUND OF THE INVENTION

UV erasable programmable read only memories (UVPROMs) are well known to those skilled in the art. These types of memories comprise distinct charge storage cells or sites and include a separate read/write line to each of the charge storage cells. In order to write data to the UVPROM, it is first bulk erased by exposing simultaneously all of the charge storage cells to UV light or radiation to leak off any charges stored by them. Then, data is written to selected charge storage cells by injecting charges in them with the corresponding read/write lines. These charges may then be detected with the read/write lines so as to read data from the charge storage cells. Since UVPROMs include separate read/write lines to the charge storage cells, the charge storage cells are not able to be spaced apart at nanometer level increments so that the overall size of the UVPROM could be reduced. However, a UVPROM type structure with charge storage cells at nanometer level increments could be used if a mechanism were developed that could (1) selectively and individually write data to each charge storage cell by leaking off a charge in the charge storage cell with UV light, and (2) electrically read data from each storage cell by detecting or sampling a charge in the charge storage cell without a read line to the charge storage cell.

Moreover, recently attempts have been made at providing data storage devices where data can be electrically or mechanically written to and electrically read from a storage medium at nanometer level increments. However, these data storage devices all suffer from significant problems.

For example, U.S. Pat. No. 5,317,533, describes a data storage device utilizing scanning tunneling microscope (STM) probes to read and write data to a storage medium by producing and measuring tunneling currents between the STM probes and the storage medium. Furthermore, U.S. Pat. No. 5,289,408 describes a similar data storage device with a piezoelectric positioning apparatus for positioning STM probes over the storage medium to read and write data to the storage medium. This positioning apparatus is bulky and impractical to use as a part of a data storage device in a computing system. Moreover, since positioning of the STM probes over the storage medium in the X and Y directions is limited to the range of movement of the X and Y piezoelectric translator elements of the positioning apparatus, the storage capacity of this data storage device is also limited by this range of movement. And, to increase this range of movement so that the storage capacity of the data storage device is increased, the size of the X and Y piezoelectric translator elements must also be increased. This unfortunately increases the overall size, read/write times, weight, and power requirements of the data storage device.

Furthermore, U.S. Pat. No. 5,038,322 describes still another data storage device that utilizes STM probes. In this storage device, the STM probes are used to deform a deformable storage medium to write data to it which is represented by the deformations. Then, by producing and measuring a tunneling current between the STM probes and the storage medium, the deformations can be identified so as to read from the storage medium the data that was written to it. However, the STM probes comprise a soft conductive material, such as conductive silicon, tungsten, aluminum, or gold which wears down after prolonged use in deforming the storage medium. Thus, the useful life of this type of data storage device is limited.

BRIEF SUMMARY OF THE INVENTION

The foregoing problems are solved by a data storage system that includes a positioning system for positioning the write/read mechanism and the storage medium of the data storage device with respect to each other in first and second predefined directions. The positioning system comprises a positioning apparatus comprising microfabricated first and second positioning assemblies.

The first positioning assembly includes a stationary support structure, a moveable support structure, a positionable support structure, a stationary support structure clamp, and a movable support structure clamp. The movable support structure is movably coupled to the stationary support structure and is moveable within a range of movement in a first predefined direction with respect to the stationary support structure. The positioning system further comprises a controller to position the positionable support structure in the first predefined direction within a range of positioning that is larger than the range of movement of the moveable support structure. It does so by controlling (A) the stationary support structure clamp in clamping and unclamping the positionable structure to and from the support structure, (B) the moveable structure clamp in clamping and unclamping the positionable support structure to and from the moveable support structure, and (C) the movement of the moveable support structure.

In one embodiment, the second positioning assembly comprises a stationary support structure and a moveable support structure. The movable support structure is movably coupled to the stationary support structure and is moveable within a range of movement in a second predefined direction with respect to the stationary support structure. The controller controls the positioning of the moveable structure in the second direction within the range of movement of the moveable structure. In another embodiment, the second positioning assembly may be constructed and controlled in the same way as the first positioning assembly.

In one embodiment, one of the write/read mechanism and the storage medium is carried by the positionable support structure so that it is positioned with the first positioning assembly. The other one of the write/read mechanism and the storage medium is positioned with the second positioning assembly. In another embodiment, the positionable support structure carries the second positioning assembly and one of the write/read mechanism and the storage medium is positioned with the second positioning assembly while the other is held stationary.

In one embodiment, the storage medium is deformable and the write/read mechanism comprises one or more write probes and one or more read probes. The write probes each include a write tip with a highly obdurate coating capable of deforming the storage medium and a write tip positioning apparatus to lower the write tip. The read probes each include a conductive read tip. The controller is used to (A) during a write mode, control the first and second positioning apparatus in positioning the write probes over the storage medium, (B) during the write mode, control each write tip positioning apparatus in lowering the corresponding write tip a predetermined amount into the storage medium so as to cause a predetermined amount of deformation in the storage medium representing data written thereto, (C) during a read mode, control the first and second positioning apparatus in positioning the read probes over the storage medium, and (D) during the read mode, produce and measure a tunneling current between each conductive read tip and the storage medium to identify a predetermined amount of deformation caused in the storage medium during the write mode so that the data written thereto is read therefrom.

In another embodiment, the data storage device comprises one or more probes each comprising a tip with a conductive highly obdurate coating capable of deforming the storage medium and a tip positioning apparatus to lower the tip. The controller in this embodiment is used to (A) during a write mode, control the probe and storage medium positioning apparatus in positioning the probes over the storage medium, (B) during the write mode, control each tip positioning apparatus in lowering the corresponding tip a predetermined amount into the storage medium so as to cause a predetermined amount of deformation in the storage medium representing data written thereto, (C) during a read mode, control the probe and storage medium positioning apparatus in positioning the probes over the storage medium, (D) during the read mode, control each tip positioning apparatus in lowering the corresponding tip close to the storage medium, and (E) during the read mode, produce and measure a tunneling current between the conductive obdurate coating of each tip and the storage medium to identify a predetermined amount of deformation caused in the storage medium during the write mode so that the data written thereto is read therefrom.

In still another embodiment, the data storage device comprises a storage medium alterable by light, one or more light emitting write probes each capable of emitting light, and one or more read probes each capable of detecting alterations of the storage medium caused by light. The controller is used in this embodiment to (A) during a write mode, control the positioning apparatus in positioning the write probes over the storage medium so that the light emitting write tips are over the storage medium, (B) during the write mode, control each light emitting write probe to emit a predetermined amount of light so as to cause a predetermined amount of alteration of the storage medium so as to write data thereto, (C) during read modes, control the positioning apparatus in positioning the read probes over the storage medium so that each read probe detects a predetermined amount of alteration of the storage medium caused during the write mode, and (D) during the read mode, measure each detected predetermined amount of alteration of the storage medium so that the data written to the storage medium during the write mode is read therefrom.

In yet another embodiment, the data storage device comprises an electrically alterable storage medium, a triangular ridge support structure, one or more conductive triangular ridges on the base structure, and an acoustic wave generator on one of the triangular ridge support structure and the storage medium to produce surface acoustic waves thereon that propagate in a direction parallel to the axial length of the triangular ridges. The controller in this embodiment is used to (A) during a write mode, control the positioning apparatus in positioning the triangular ridge support structure over the storage medium so that each triangular ridge is over a corresponding region of the storage medium to be written, (B) during the write mode, control the acoustic wave generator to produce an acoustic wave, (C) during the write mode, apply at a predetermined time across each triangular ridge and the storage medium a voltage pulse having a predetermined voltage and duration while the acoustic wave produced during the write mode propagates so that a portion of the triangular ridge above the corresponding region to be written is displaced down theretoward and the corresponding region to be written is electrically altered by a predetermined amount, (D) during a read mode, control the positioning apparatus in positioning the triangular ridge support structure over the storage medium so that each triangular ridge is over a corresponding region of the storage medium to be read, (E) during the read mode, control the acoustic wave generator to produce an acoustic wave, (F) during the read mode, with each triangular ridge at a predetermined time while the acoustic wave produced during the read mode propagates so that a portion of the triangular ridge above the corresponding region to be read is displaced down theretoward, detect a predetermined amount of electrical alteration of the corresponding region to be read caused during the write mode, (G) during the read mode, measure each detected predetermined amount of electrical alteration of the corresponding region to be read so that the data written thereto during the write mode is read therefrom.

In still yet another embodiment, the positioning system is used in a biochemical instrument. The biochemical instrument comprises a probe that includes a porous tip and a tip positioning apparatus to position the tip with respect to a sample material. The positioning apparatus is used to position the probe and sample material with respect to each other. The controller is used to (A) control the positioning apparatus in positioning the probe over the sample, and (B) control the tip positioning apparatus in lowering the tip into the sample material to produce a biochemical interaction between the porous tip and the sample material.

BRIEF DESCRIPTION OF THE DRAWINGS

FIG. 4 shows a cross sectional side view of the positioning system of FIG. 1 along the line 4-4.

FIG. 5 shows a cross sectional side view of the positioning system of FIG. 1 along the line 5-5.

FIG. 6 shows a cross sectional side view of the positioning system of FIG. 1 along the line 6-6.

FIG. 7 shows a cross sectional side view of the positioning system of FIG. 1 along the line 7-7.

DETAILED DESCRIPTION OF THE INVENTION

The present invention primarily concerns various types of data storage systems. These data storage systems are related by their positioning systems, storage mediums, and/or read/write mechanisms.

Positioning System

Figure 1:
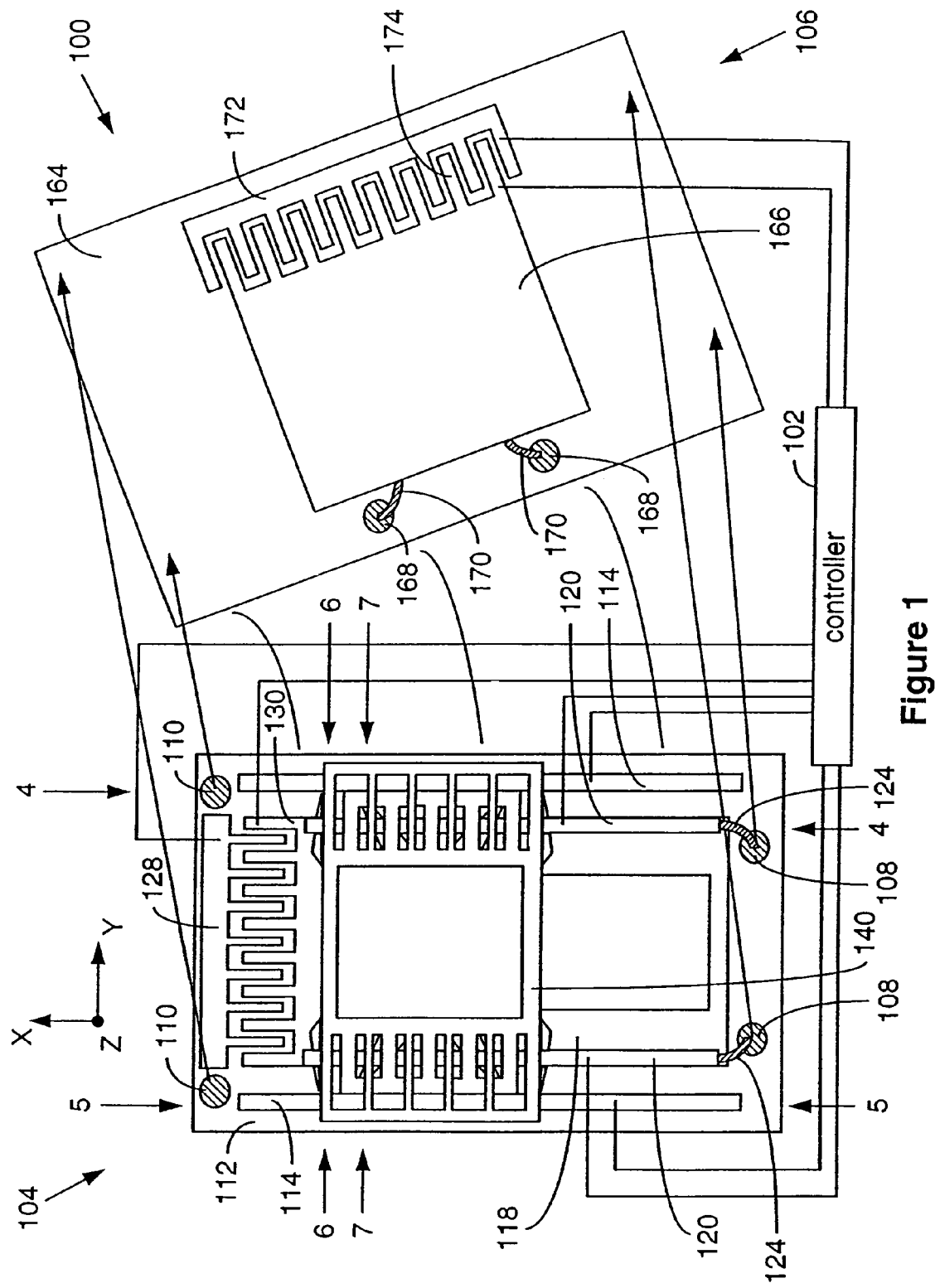
FIG. 1 shows a positioning system in accordance with the present invention.

Referring to FIG. 1, there is shown a positioning system 100 for positioning objects at nanometer level or scale increments. As will be more evident from the following discussions, the positioning system may be used as the positioning system in the data storage devices described herein or as the positioning system in measuring systems (such as atomic force microscopes (AFMs), scanning tunneling microscopes (STMs), optical microscopes, and near-field microscopes), microfabrication systems, or other instruments that require precise positioning.

Positioning system 100 includes a programmed controller 102 and a microfabricated XY translator or positioning apparatus comprising an X translator assembly 104 to move an object in the X direction and a Y translator assembly 106 to move an object in the Y direction. When assembled, the X and Y translator assemblies are mounted together with mounting pedestals or bumps 108 and 110. The assembled X and Y translator assemblies are sealed airtight in a vacuum or are evacuated as a final assembly step. Operation in a vacuum substantially improves the operational speed of all mechanical elements of the positioning system and also inhibits the formation of oxides on these elements. Alternatively, the positioning system may be assembled in and filled with an inert gas, such as argon, at or near atmospheric pressure.

X translator assembly 104 may be formed of a semiconductive material, such as silicon, and comprises a stationary support structure and a moveable support structure movably coupled to the stationary support structure. The stationary support structure comprises a stationary support structure base 112 and a pair of stationary support structure rails or bars 114. The stationary support structure base and rails are integrally connected together. The moveable support structure comprises a moveable support structure base 118 and a pair of moveable support structure rails 120. The moveable support structure base and rails are integrally connected together.

Furthermore, referring to FIGS. 1 and 4, mounting pedestals 108 and 110 are integrally connected to stationary support structure base 112. Spring connectors 124 are integrally connected to mounting pedestals 108 and are integrally connected to one end of moveable support structure base 118 and physically suspend this end over the stationary support structure base. Moreover, the spring connectors act as springs. Thus, the moveable support structure is physically movably coupled to the stationary support structure by mounting pedestals 108 and spring connectors 124.

Referring back to FIG. 1, to move or drive the moveable support structure, X translator assembly 104 also includes an electrostatic comb drive or actuator comprising a stationary comb structure 128 and a moveable comb structure 130. The stationary comb structure is integrally connected to stationary support structure base 112. The moveable comb structure is integrally connected to moveable support structure base 118.

The electrostatic comb drive is of the type and operates in the manner described in "Electrostatic Comb Drive for Resonant Sensor and Actuator Applications", University of California at Berkeley Doctoral Dissertation, by William Chi-Keung Tang Nov. 21, 1990, which is hereby explicitly incorporated by reference. Specifically, the comb fingers of moveable comb structure 130 are aligned between the comb fingers of stationary comb structure 128. And, referring to FIGS. 1 and 4, the stationary and moveable comb structures are made to be conductive so that when a differential voltage is applied across them, their comb fingers interact electrostatically with each other and the moveable comb structure is electrostatically suspended over stationary support structure base 112 and moves with respect to the stationary comb structure in the X direction. Thus, since one end of moveable support structure base 118 is integrally connected to the moveable comb structure, the moveable support structure is electrostatically movably coupled to the stationary support structure and is moveable in the X direction.

Turning again to FIG. 1, in order to control the electrostatic comb drive described above, positioning system 100 includes controller 102. The controller is electrically coupled to stationary and moveable comb structures 128 and 130 and provides a differential voltage across them. By controlling the level of the differential voltage, the controller can control movement of or drive the moveable support structure back and forth in the X direction over the stationary support structure with the electrostatic comb drive. For example, when a suitably large differential voltage is applied, the moveable support structure moves toward the mounting pedestals 108 and forces spring connectors 124 to be deflected to a position different then their normal undeflected position. Then, when no or a suitably small differential voltage is applied, the spring connectors return to their normal undeflected position and force the moveable support structure back to or to be retracted to its original position.

Moreover, controller 102 can control movement of the moveable support structure in nanometer level increments (e.g., 10 nanometer increments). In other words, the controller can control positioning of the moveable support structure at the nanometer level. However, as is evident from the foregoing, the moveable support structure has only a limited range of movement in the X direction at the micrometer level (e.g., 35 to 45 micrometers).

In an alternative embodiment, a second electrostatic comb drive replaces mounting pedestals 108 and spring connectors 124 to electrostatically move and suspend one end of the moveable support structure base 118. Thus, in this case, the second electrostatic comb drive is used similarly to and in conjunction with the earlier described electrostatic comb drive to electrostatically movably couple the moveable support structure to the stationary support structure.

Figure 2:
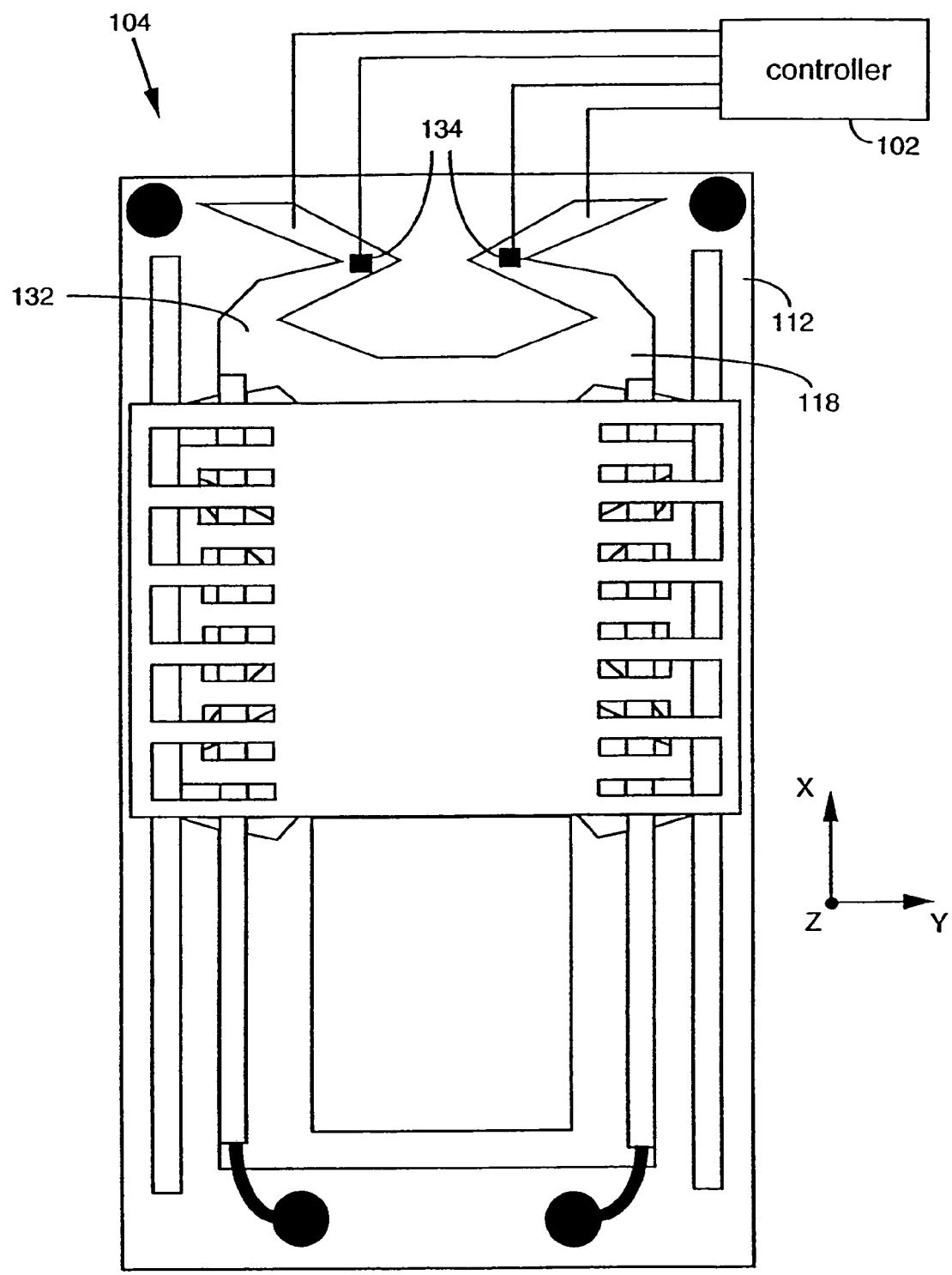
FIG. 2 shows another embodiment of the positioning system of FIG. 1.

In another embodiment, as shown in FIG. 2, the electrostatic comb drive of X translator assembly 104 is replaced by a heater drive comprising a thermally expandable and contractible structure 132 and heater elements 134 on the thermally expandable and contractible structure. One end of the thermally expandable and contractible structure is integrally connected to stationary support structure base 112. The other end of the thermally expandable and contractible structure is integrally connected to moveable support structure base 118 and suspends over the stationary support structure base the end of the moveable support structure base coupled to it. The heater elements are used to selectively heat the thermally expandable and contractible structure so that it thermally expands and contracts and moves back and forth in the X direction. Thus, since one end of the moveable support structure base is integrally connected to the thermally expandable and contractible structure, the moveable support structure is physically movably coupled to the stationary support structure by the thermally expandable and contractible structure and is moveable back and forth in the X direction.

Furthermore, in this embodiment, to control the heater drive just described, controller 102 is electrically coupled to heater elements 134 and thermally expandable and contractible structure 132 to provide a current that flows through the heater elements. By controlling the amount of current that flows through the heater elements, the controller can control positioning of the moveable support structure in nanometer level increments in the X direction in a similar manner to that described earlier for the embodiment of FIG. 1.

Figure 3:
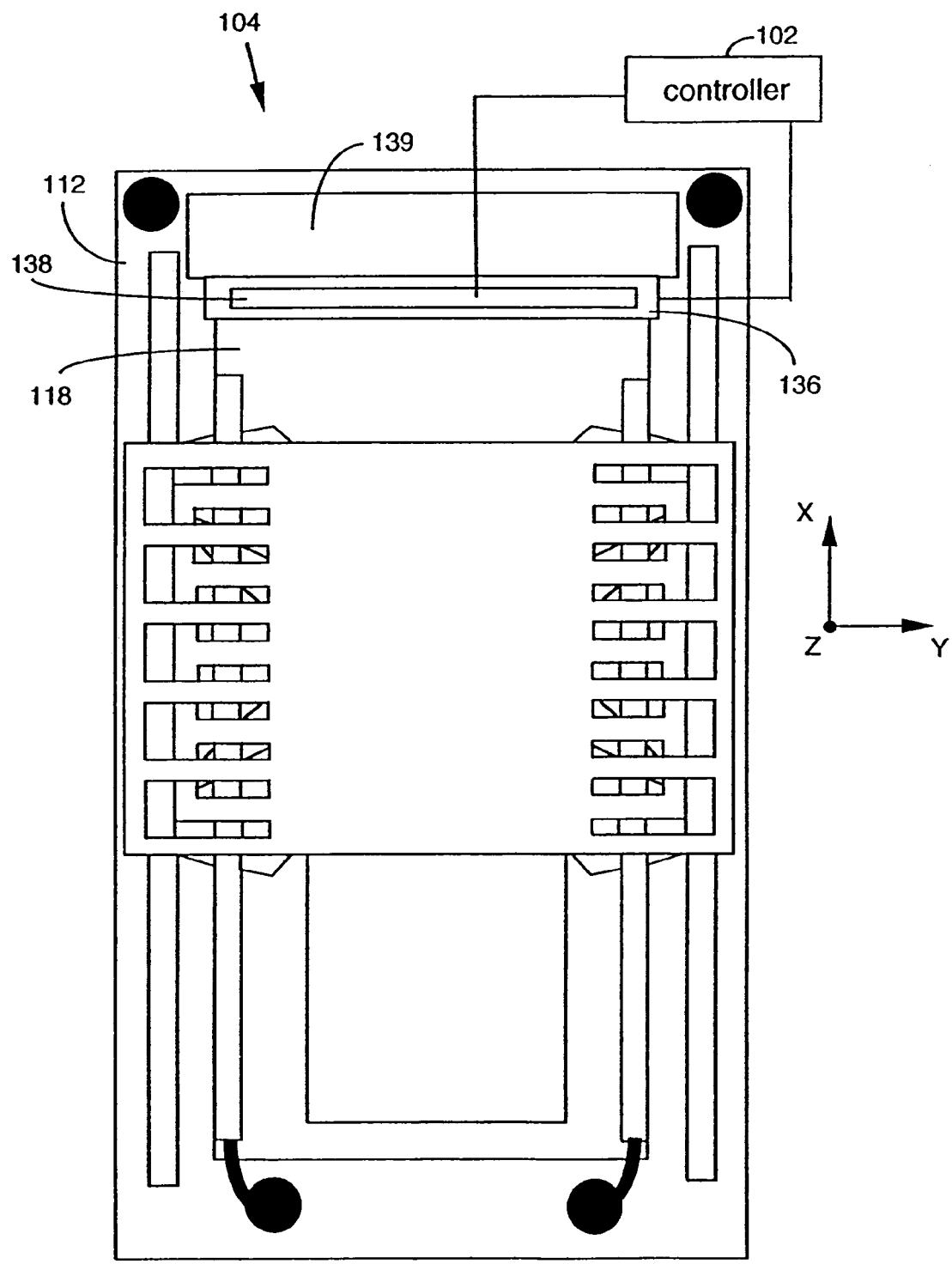
FIG. 3 shows yet another embodiment of the positioning system of FIG. 1.

In another embodiment shown in FIG. 3, a piezoelectric drive formed by a piezoelectric structure 136 and electrodes 138 fixed to the piezoelectric structure (with the electrode on the underside of the piezoelectric structure not being shown) is used to control movement of the moveable support structure of X translator assembly 104. The piezoelectric structure may comprise silicon dioxide such that one end of the piezoelectric structure is integrally connected to moveable support structure base 118 and suspends over stationary support structure base 112 the end of the moveable support structure base coupled to it. The other end of the piezoelectric structure is integrally connected to a stationary suspension structure 139 which is itself integrally connected to the stationary support structure base and suspends the piezoelectric structure over the stationary support structure base. The electrodes are used to selectively apply a voltage to the piezoelectric structure to expand and contract it so that it moves back and forth in the X direction. Thus, since one end of the moveable support structure base is connected to the piezoelectric structure, the moveable support structure is physically movably coupled to the stationary support structure by the piezoelectric structure and is moveable in the X direction.

To control the piezoelectric drive just described, controller 102 is electrically coupled to electrodes 138 so that it can provide a voltage across the electrodes which is applied to piezoelectric structure 136 by the electrodes. The controller can control positioning of the moveable support structure in nanometer level increments back in the X direction over the stationary support structure in a similar manner to that described earlier for the embodiment of FIG. 1. It does so by controlling the level of voltage applied to the piezoelectric structure.

Furthermore, turning again to FIG. 1, the stationary support structure includes stationary support structure rails 114 and the moveable support structure includes moveable support structure rails 120, as alluded to earlier. As shown in FIG. 5, each of the stationary support structure rails have ends integrally connected to stationary support structure base 112 and have rail portions that are spaced from the stationary support structure base. In addition, referring to FIG. 4, the moveable support structure rails each have ends integrally connected to moveable support structure base 118 and have rail portions that are spaced from the moveable support structure base.

Referring back to FIG. 1, X translator assembly 104 further includes a positionable support structure 140 which carries an object to be moved in the X direction. The X translator assembly also includes a moveable support structure rail clamp and a stationary support structure rail clamp to help position the positionable support structure and the object it carries at the nanometer level in the X direction over a range of positioning that is greater than the range of movement of the moveable support structure.

Figure 8:
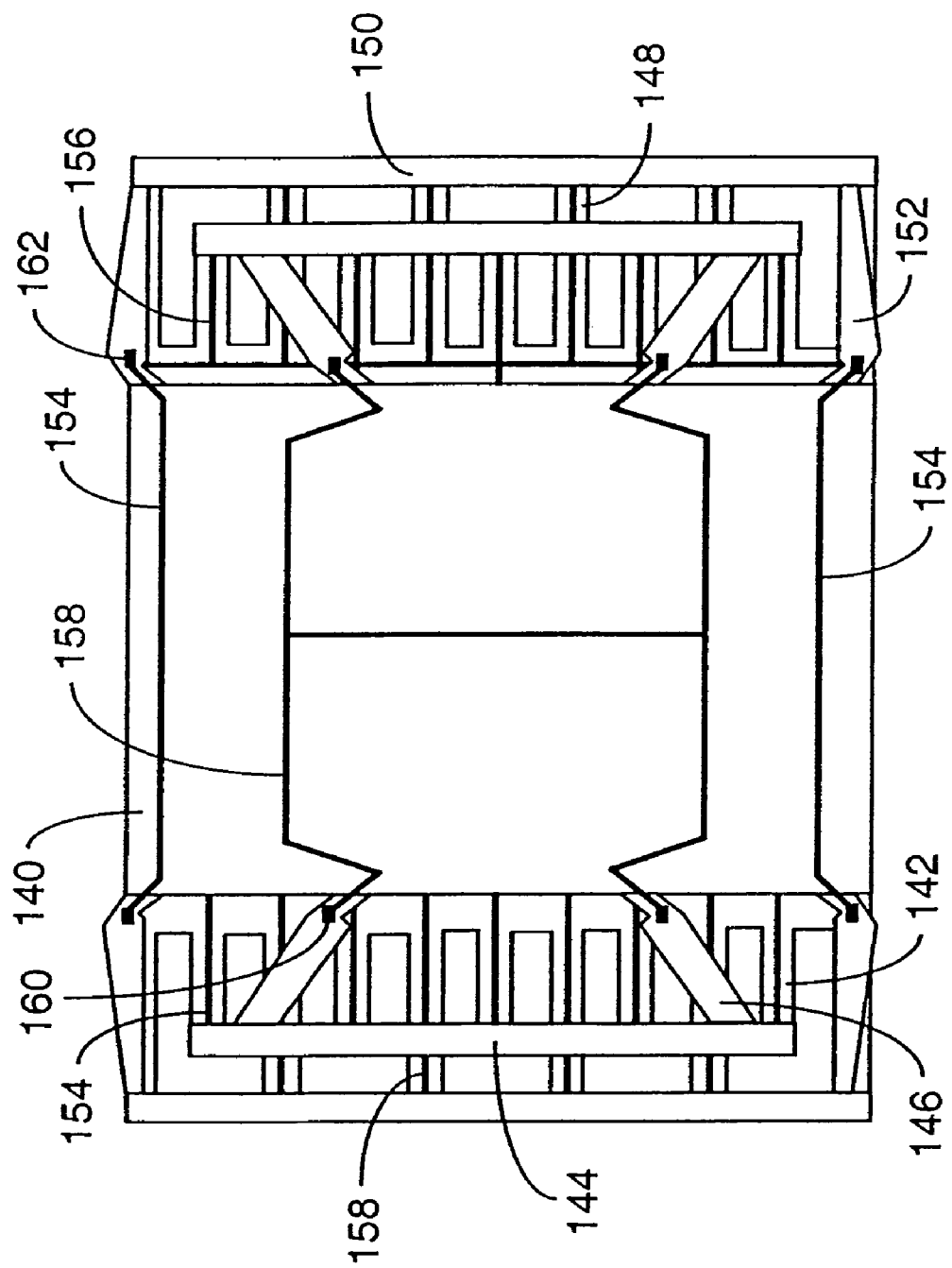
FIG. 8 shows the positionable support structure of the positioning system of FIG. 1.

As shown in FIGS. 6-8, the moveable support structure rail clamp comprises clamping bar extensions or fingers 142, clamping bars 144, push arms 146, and heater elements 160. The stationary support structure rail clamp comprises clamping bar extensions 148, clamping bars 150, push arms 152, and heater elements 162.

Referring to FIGS. 6 and 7, clamping bar extensions 142 are integrally connected to positionable support structure 140 and extend over moveable support structure rails 120 and bend down toward moveable support structure base 118. Similarly, clamping bar extensions 148 are integrally connected to the positionable support structure and extend over stationary support structure rails 114 and bend down toward stationary support structure base 112.

The curved shape of clamping bar extensions 142 and 148 is due to several factors. First, referring to FIG. 8, the underside of positionable support structure 140 includes conductive interconnects or lines 154, 156, and 158. These interconnects may comprise tungsten and are patterned on and throughout the positionable support structure including on the undersides of the clamping bar extensions. The tensile force of the interconnects on the undersides of the clamping bar extensions helps produce their curved shape. Second, referring back to FIGS. 6 and 7, during fabrication, the clamping bar extensions are doped with phosphorous which also helps in producing their curved shape.

Still referring to FIGS. 6 and 7, clamping bars 144 and 150 respectively bend in toward moveable and stationary support structure rails 120 and 114 because they are respectively integrally connected to curve shaped clamping bar extensions 142 and 148. Furthermore, when push arms 146 and 152 are in their natural positions, clamping bars 144 and 150 respectively bend in an engage moveable and stationary support structure rails 120 and 114. This is due to the fact that, in their natural position, push arms 146 and 152 do not extend out far enough in the Y direction to respectively engage clamping bars 144 and 150. As a result, under these conditions, positionable support structure 140 is clamped and coupled to the moveable and stationary support structure rails.

Moveable and stationary support structure rails 120 and 114 are made to be conductive. Referring to FIG. 8, therefore, when the moveable support structure clamp clamps positionable support structure 140 to the moveable support structure rails, the moveable support structure rails are respectively electrically coupled to interconnects 154 and 156. Similarly, when the positionable support structure is clamped to the stationary support structure rails by the stationary support structure clamp, the stationary support structure rails are respectively electrically coupled to interconnects 156 and 158.

Furthermore, positionable support structure 140 and push arms 146 and 152 are made to be conductive or semiconductive and are electrically coupled to interconnect 156. And, interconnect 154 is electrically coupled to heater elements 160 located on stationary support structure rail clamping push arms 148. Moreover, interconnect 158 is electrically coupled to heater elements 162 located on moveable support structure rail clamping push arms 142.

Therefore, when positionable support structure 140 is clamped to stationary support structure rails 114, and no or a suitably small differential voltage is applied across them, no current flows through interconnect 154, heater elements 160, and interconnect 156. As a result, push arms 146 remain in their normal positions because heater elements 160 are not activated. However, when a suitably large differential voltage is applied across the stationary support structure rails, current does flow through interconnect 154, heater elements 160, and interconnect 156. Since heater elements 160 are located on push arms 142 at locations opposite the notches of the push arms, they heat the push arms so that they bend in at their notches and extend out in the Y direction away from positionable support structure 140. As a result, the push arms engage moveable support structure rail clamping bars 144 and push these clamping bars away from the moveable support structure rails so that the clamping bars are disengaged from the moveable support structure rails. Thus, the positionable support structure is unclamped and uncoupled from (i.e., released from being clamped to) the moveable support structure rails.

Similarly, push arms 152 remain in their normal positions when positionable support structure 140 is clamped to moveable support structure rails 120 and no or a suitably small differential voltage is applied across them. This is due to the fact that heater elements 162 are not activated in this case since no current flows through interconnect 158, heater elements 162, and interconnect 156. However, when a suitably large differential voltage is applied across the moveable support structure rails, current does flow through interconnect 158, heater elements 162, and interconnect 156. Since heater elements 162 are located on the moveable support structure clamping rail push arms at the notches of these push arms, they heat these push arms so that they bend out at their notches and extend out in the Y direction away from positionable support structure 140. As a result, they engage stationary support structure rail clamping bars 150 and push these clamping bars away from the stationary support structure rails so that these clamping bars are disengaged from the stationary support structure rails. Thus, the positionable support structure is unclamped and uncoupled from the stationary support structure rails.

Referring back to FIG. 1, controller 102 is electrically coupled to the moveable and stationary support structure rails 120 and 140 to provide appropriate differential voltages across the moveable support structure rails and across the stationary support structure rails so as to produce the clamping and unclamping functions of the moveable and stationary support structure rail clamps just described. In other words, by controlling the level of the differential voltage, the controller can control the clamping and unclamping of the positionable support structure to and from the moveable and stationary support structure rails.

Controller 112, the electrostatic comb, heater, and piezoelectric drives described earlier, the moveable support structure, the stationary support structure, and the moveable and stationary support structure rail clamps just described work cooperatively together to provide a means to position positionable support structure 140 and the object it carries at the nanometer level in the X direction over a range of positioning that is greater then the range of movement of the moveable support structure. To do this, the controller initially applies a suitably large differential voltage across moveable support structure rails 120 to unclamp the positionable support structure from stationary support structure rails 114 and no or a suitably small differential voltage across stationary support structure rails 120 to keep the positionable support structure clamped to the moveable support structure rails. Then, the controller applies a suitable differential voltage across stationary and moveable comb structures 128 and 130 to move the moveable support structure in the X direction. Since the positionable support structure is clamped to the moveable support structure rails, the positionable support structure and the object it carries are both carried by the moveable support structure. As alluded to earlier, this may be done in nanometer level increments for positioning of the positionable support structure and the object it carries at the nanometer level.

Then, when the maximum distance (i.e., range of movement) of the moveable comb structure in the X direction has been reached, controller 112 applies no or a suitably small differential voltage across moveable support structure rails 120 to clamp positionable support structure 140 to the stationary support structure rails and a suitably large differential voltage across stationary support structure rails to unclamp the positionable support structure from the moveable support structure rails. The controller then applies a suitable differential voltage across stationary and moveable comb structures 128 and 130 to reposition or retract the moveable support structure in the X direction so that it can again move the maximum distance in the X direction. The process just described is then repeated until the positionable support structure and the object it carries have been positioned at the desired point in the X direction. Thus, the positionable support structure and the object it carries can be positioned anywhere along the length of the rail portions of the stationary support structure rails. Since the rail portions of the stationary support structure rails may have lengths in the millimeter range, the range of positioning of the positionable support structure and the object it carries will in this case be at the millimeter level or scale and will be greater than the range of movement of the moveable support structure.

Furthermore, as alluded to earlier and shown in FIG. 1, positioning system 100 also includes a Y translator assembly 106. The Y translator assembly may be comprised of a semiconductive material, such as silicon, and includes a stationary support structure 164, a moveable support structure 166, a pair of pedestals 168, and a pair of spring connectors 170. These components respectively correspond to stationary support structure base 112, moveable support structure base 118, pedestals 108, and spring connectors 124 of X translator assembly 104 and are constructed and operate similarly.

Additionally, Y translator assembly 106 also includes an electrostatic comb drive comprising a stationary comb structure 172 and a moveable comb structure 174. The stationary and moveable comb structures respectively correspond to stationary comb structure 128 and moveable comb structure 130 of X translator assembly 104 and are constructed and operate similarly. Controller 102 is coupled to the electrostatic comb drive of the Y translator assembly in the same manner as it is coupled to the electrostatic comb drive of the X translator assembly. As a result, it can control positioning of moveable support structure 166 and the object it carries in the Y direction in a similar manner as was described earlier for the moveable support structure of the X direction movement assembly of FIG. 1.

In alternative embodiments, the electrostatic comb drive may be replaced by a heater drive or a piezoelectric drive. These heater and piezoelectric drives would operate and be constructed similarly to the heater drive and piezoelectric drives of FIGS. 2 and 3 and be controlled by controller 102 in the same way as was described earlier.

In another alternative embodiment, Y translator assembly 106 could be mounted to or integrally connected to positionable support structure 140 of X translator assembly 104. In this case, in positioning two objects relative to each other, one of the objects would be kept stationary and the other object would be carried by moveable support structure 166 of the Y translator assembly. Furthermore, in still another alternative embodiment, Y translator assembly 106 would be replaced by another Y translator assembly that is constructed similar to X translator assembly 104.

MECHANICAL WRITE/ELECTRICAL READ EMBODIMENT

Figure 9:
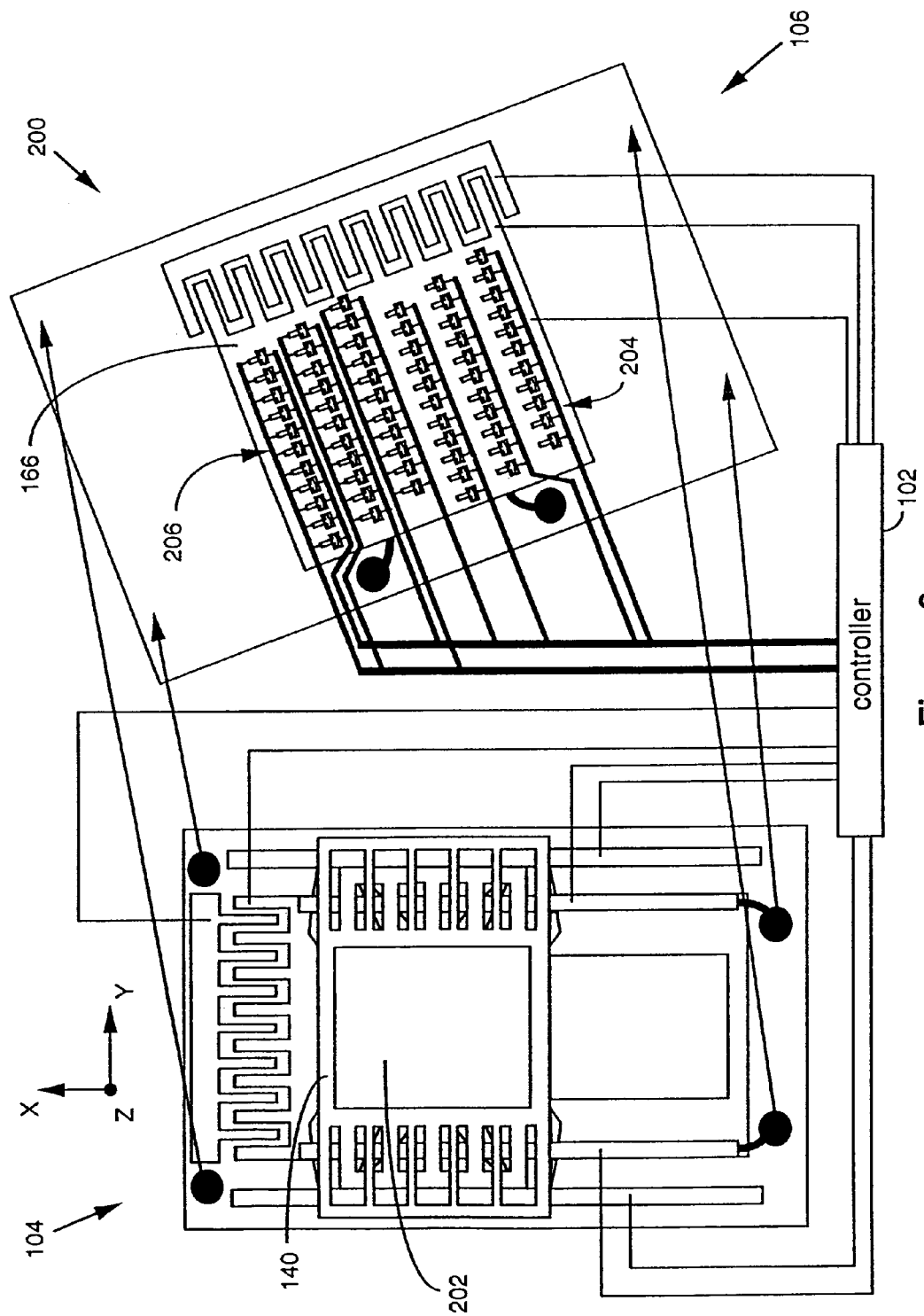
FIG. 9 shows a data storage device in accordance with the invention which includes the positioning system of FIG. 1.

Referring to FIG. 9, there is shown a data storage device 200 that includes the XY translator apparatus and controller 102 of positioning system 100 described earlier. In addition, it includes a storage medium 202 and a read/write mechanism comprising one or more write probes 204 and one or more read probes 206. Controller 102 is used in the data storage device not only to control the XY translator apparatus in positioning the read and write probes and the storage medium with respect to each other in the X and Y directions, but also in controlling mechanical writing of data to and electrical reading of data from the storage medium by the write and read probes.

Storage medium 202 is carried by positionable support structure 140 of X translator assembly 104. Write and read probes 204 and 206 are carried by moveable support structure 166 of Y translator assembly 106. Alternatively, the storage medium may be carried by the moveable support structure of the Y translator assembly and the write and read probes may be carried by the positionable support structure of the X translator assembly. Moreover, the storage medium and the write and read probes may be positioned with respect to each other with any of the alternative embodiments described earlier for positioning device 100 or with a standard piezoelectric XY translator apparatus.

Figure 10:
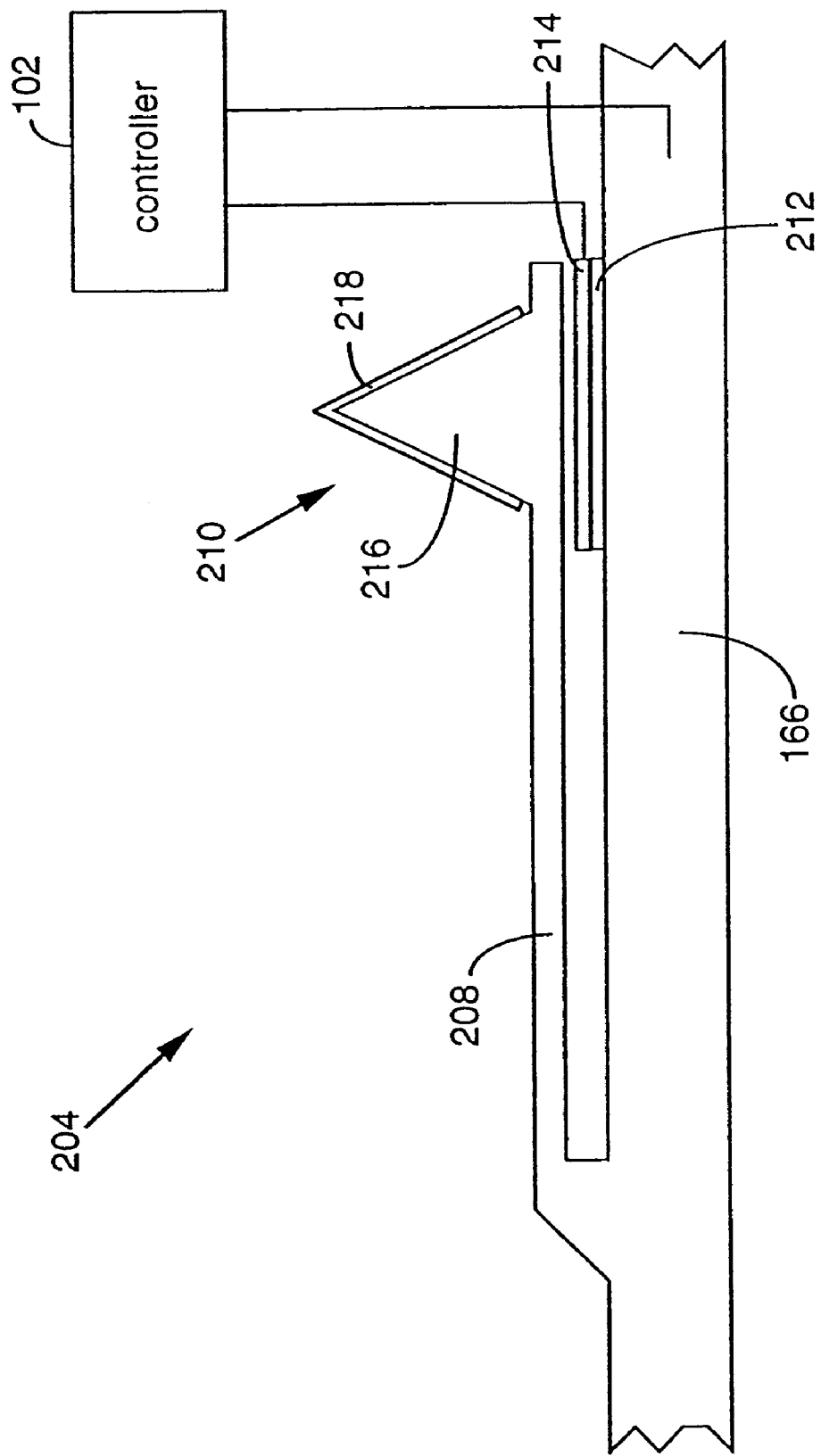
FIG. 10 shows a write probe capable of being used in the data storage device of FIG. 9.

To write up to 33 data bits or data values at a time to storage medium 202 during a write mode or cycle, write probes 204 can be arranged in three rows of eleven, as shown in FIG. 9. As shown in FIG. 10, each write probe includes a tapered write tip 210 and a Z translator or write tip positioning apparatus for positioning the write tip with respect to the storage medium in the Z direction.

The Z translator apparatus comprises a cantilever 208 and a cantilever mover. The cantilever mover is a capacitor formed by moveable support structure 166, an insulating layer or pad 212, and a conductive layer or pad 214. The cantilever is integrally connected to the moveable support structure and the write tip is integrally connected to and on the cantilever.

Each write probe 204 has a core material 216 that comprises a conductive or semiconductive material, such as silicon. The core material of each write tip 210 is preferably coated with a highly obdurate coating 218, such as diamond, silicon carbide, or carbon nitride, which is capable of deforming storage medium 202 and is more obdurate than conductive silicon, tungsten, aluminum, or gold used in conventional STM tips. This is to reduce frictional wear from long term use in deforming the storage medium. The obdurate coating may have a thickness in the range of approximately 5 Angstroms to 1 micrometer.

Figure 11:
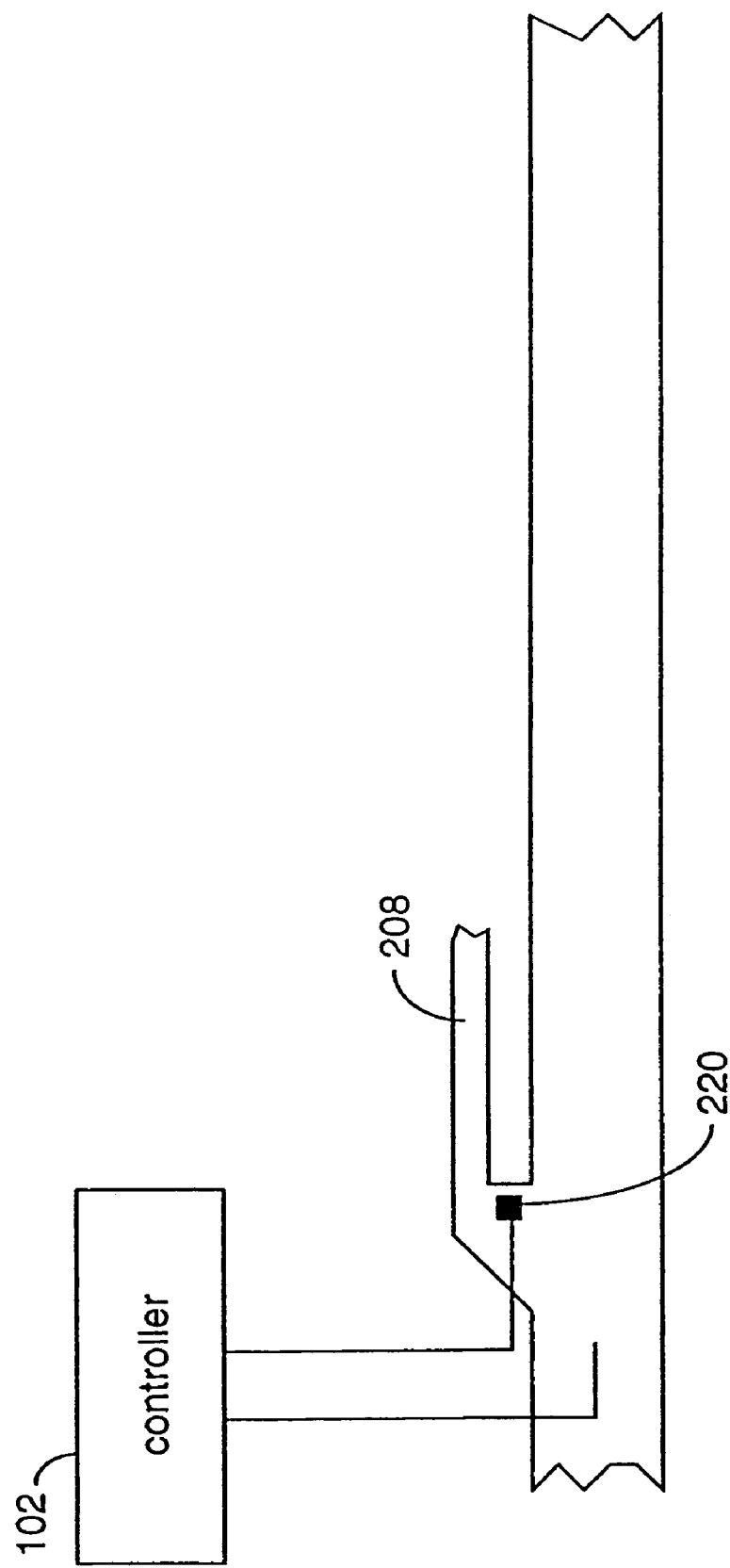
FIG. 11 shows another embodiment of the tip positioning apparatus of the probes of FIGS. 10, 12.

In the case where obdurate coating 218 comprises diamond, write probes 204 are first placed in a vacuum chamber containing carbon. A mask is placed over each probe so that only tip 210 is exposed. At a pressure of approximately $1 \times 10^{-7}$ to $1 \times 10^{-11}$, the carbon is heated to a temperature of approximately 2100 to 3000□ C. The carbon condenses on the surface of core material 216 to form seed sights. Alternatively, the seed sights may be formed by pushing or rubbing each write tip 210 on a surface containing fine grain diamond (such as a lap or polycrystalline diamond coated surface). Referring to FIG. 11, write probes 204 are then placed in a methane hydrogen atmosphere for chemical vapor deposition (CVD) of diamond on the surface of the core material. As a result of the seed sights, a polycrystaline diamond coating 212 is grown on the core material with the diamond crystals being grown normal to the surface of the core material. Growth of diamond crystals is further described in Deposition, Characterization, and Device Development in Diamond, Silicon Carbide, and Gallium Nitride Thin Films, by Robert F. Davis, Journal of Vacuum Science and Technology, volume A 11(4) (July/August 1993), which is hereby explicitly incorporated by reference.

Moreover, during the deposition process, a bias voltage may be applied to the core material. This voltage should be sufficient to create an electrical field at the sharp end of the write tip large enough so that the diamond crystals grown at the sharp end of the write tip are symmetrically aligned but small enough so that the diamond crystals grown below the sharp end of the write tip are not symmetrically aligned. The advantage of this is to obtain a consistent orientation and tip behavior at the sharp end without sacrificing the durability and stability of the diamond coating below the sharp end.

Moreover, in the case where the obdurate coating 218 comprises silicon carbide, the coating may be grown in the manner described in Deposition, Characterization, and Device Development in Diamond, Silicon Carbide, and Gallium Nitride Thin Films just referenced.

And, when the obdurate coating 218 comprises carbon nitride, the same seeding processes as was just described for diamond growth may be used. Then, write probes 204 are placed in an atmosphere of monatomic nitrogen. The monatomic nitrogen is obtained by passing nitrogen gas through a hollow tungsten heater consisting of a hollow tungsten structure through which an electric current is passed. The tungsten heater is maintained at a temperature of 2100 to 3000 □C. In one embodiment, the tungsten heater also includes a quantity of carbon sufficient to combine chemically to form a carbon nitride layer on the carbon seed sites at the cool surface (800 □C) of core material 216. In another embodiment, the process begins without introducing nitrogen gas. After a few atoms of carbon are deposited, the nitrogen gas is introduced into the tungsten electrode and deposition and growth of the polycrystalline carbon nitride coating is initiated.

The types of probes just described are even further described in copending U.S. patent application Ser. No. 08/281,883, entitled "Scanning probe Microscope Assembly and Method for making Spectrophotometric, Near-Field, and Scanning Probe Measurements", by Victor B. Kley, which is hereby explicitly incorporated by reference.

As alluded to earlier, each write probe 204 includes a Z translator apparatus comprising cantilever 208 and a capacitor formed by moveable support structure 166, insulating layer 212, and conductive layer 214. The moveable support structure is made to be conductive or semiconductive. In addition, the insulating layer may comprise silicon dioxide and the conductive layer may comprise tungsten. Controller 102 is electrically coupled to the moveable support structure and the conductive layer. By applying a suitably large voltage across them, the controller can control enough energy storage by the capacitor of the Z translator apparatus so as to electrostatically move cantilever 208 from its normal undeflected position to a deflected position and raise write tip 210 in the Z direction away from storage medium 202. By applying no or a suitably small voltage across the moveable support structure and the conductive layer, the controller can control release of energy storage by the capacitor of the Z translator apparatus so as to move cantilever 208 from its deflected position towards its normal undeflected position and lower write tip 210 in the Z direction toward the storage medium.

Referring to FIG. 11, in an alternative embodiment, the Z translator apparatus of each write probe 204 may comprise, in addition to cantilever 208, a heater element 220 as the cantilever mover instead of the capacitor of the positioning apparatus of FIG. 10. The heater element is located on the cantilever at the notch formed between the cantilever and moveable support structure 166. Controller 102 is electrically coupled to the moveable support structure and the heater element. By applying a suitably large voltage across them, the controller can produce a current through the heater element to thermally expand the cantilever at the notch so as to move it from its normal undeflected position to a deflected position and lower write tip 210 in the Z direction toward storage medium 202. And, by applying no or a suitably small voltage across moveable support structure and the heater element, the controller produces no current through the heater element and the cantilever thermally contracts at the notch and returns from its deflected position to its normal undeflected position so as to raise write tip in the Z direction away from the storage medium.

Additionally, in still another embodiment, the Z translator apparatus of each write probe 204 may be a conventional piezoelectric translator. In this case, write tip 210 of each write probe is connected to the piezoelectric translator and controller 102 is coupled to the piezoelectric translator to expand and contract it so as to lower or raise the write tip in the Z direction.

Referring back to FIG. 9, storage medium 202 comprises a deformable conductive material which is capable of being deformed by the obdurate coatings of write tips 210. This material may comprise gold, silicon, carbon, aluminum, silver, or tin.

Furthermore, still referring to FIG. 9, in a write mode, controller 102 first controls the XY translator apparatus in positioning the write probes over an area or region of storage medium 202 to be written. Since controller 102 is separately electrically coupled to the Z translator apparatus of each write probe 204 in the manner described earlier, it can selectively or individually control the lowering of each write tip 210 in the Z direction to write individual data bits or data values to storage medium 202 during the write mode. Specifically, during the write mode, each write tip may be selectively and individually lowered a selected predetermined amount into the storage medium in the manner just described to cause a selected predetermined amount of deformation or indentation in the storage medium which represents digital or analog data. In an embodiment for writing binary bits of digital data with each write tip, a data bit of value "1" and a data bit of value "0" are represented by two different predetermined amounts of deformation of the storage medium. Thus, for example, a data bit of value "0" may be represented by no deformation and a data bit of value "1" may be represented by a specific amount of deformation. However, in an embodiment for writing a larger range of digital data values or analog data values with each write tip, a range of discrete predetermined amounts of deformation would represent a range of digital data values and a continuous range of predetermined amounts of deformation would represent a range of analog data values. Thus, for example, in either case the range of predetermined amounts of deformation may range from no deformation representing a minimum data value to a maximum amount of deformation representing a maximum data value.

The write operation just described is similarly described in U.S. Pat. No. 5,038,322 referred to earlier and hereby explicitly incorporated by reference. Moreover, since in the embodiment of FIG. 9 there are 33 write probes 204, up to 33 data bits or data values at a time may be written to storage medium 202 during a write mode in this manner.

In order that the data written to storage medium 202 may be properly read, a pattern of tracks at regularly spaced intervals are formed on the storage medium. These tracks may be created using conventional photolithography during the microfabrication process. Alternatively, they may be a series of deformations created in the storage medium with write tips 210 in the manner described earlier. These tracks may be read out as data bits or data values along with the actual data bits or data values written to storage medium in the manner described next.

Referring to FIG. 9, to read up to 33 data bits or data values at a time from storage medium 202 during a read mode, read probes 206 may be arranged in three rows of eleven. And, referring to FIG. 12, each read probe includes a tapered read tip 222 and a Z translator or read tip positioning apparatus for positioning the read tip in the Z direction.

The Z translator apparatus is constructed and operates like the Z translator apparatus of each write probe and therefore comprises a cantilever 208 and a capacitor formed by moveable support structure 166, an insulating layer 212, and a conductive layer 214. The cantilever is integrally connected to the moveable support structure and the read tip is integrally connected to and on the cantilever. Alternatively, the Z translator apparatus of each read probe 206 may comprise one of the apparatuses discussed earlier as alternative embodiments to the Z translator apparatus of each write probe 204. Thus, each read tip may be selectively and individually lowered toward or raised away from the storage medium in the Z direction in a similar manner to that described earlier for each write tip 210.

Figure 12:
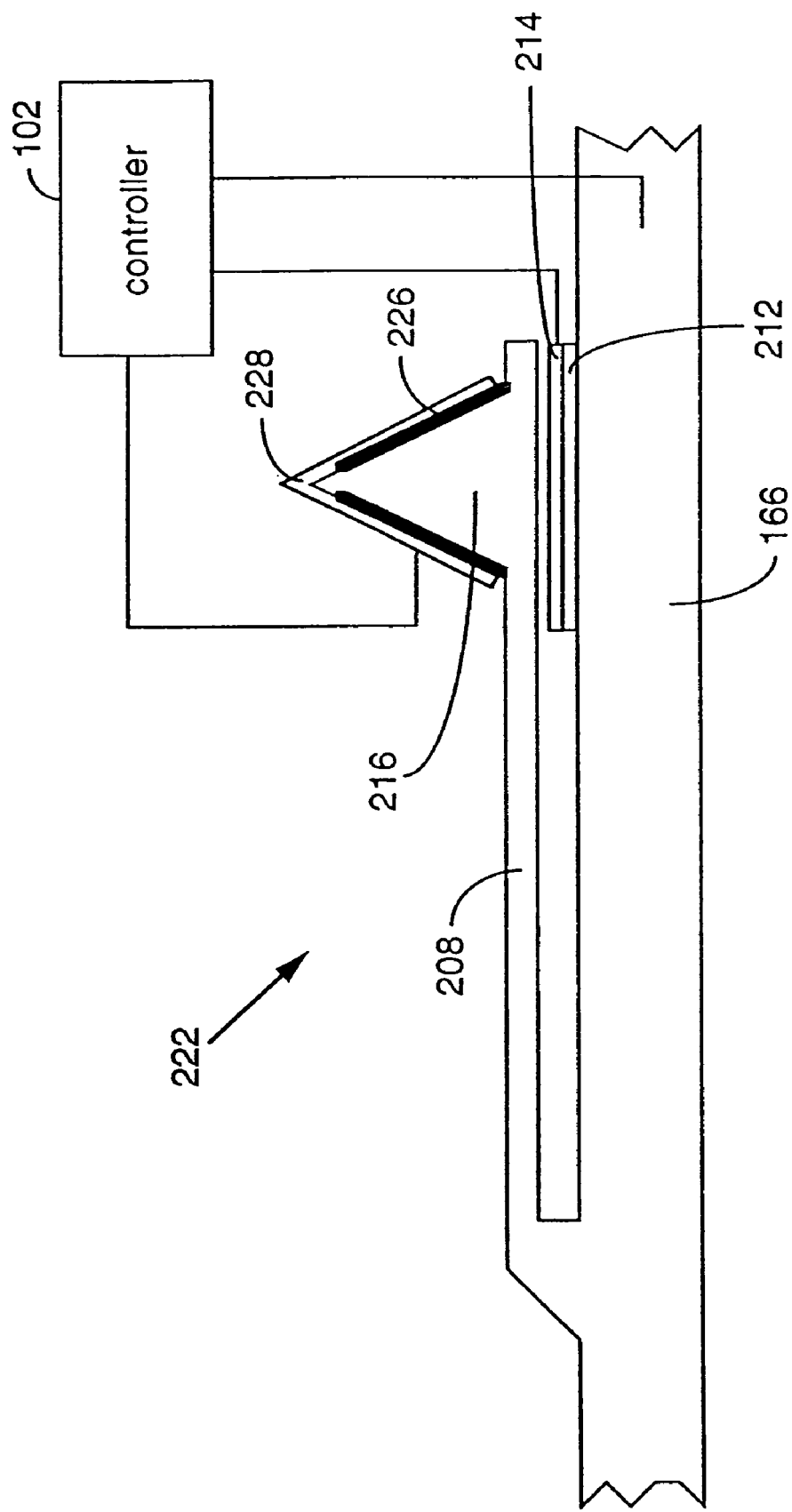
FIG. 12 shows a read probe capable of being used in the data storage device of FIG. 9.

Referring to FIG. 12, like each write probe 204, each read probe 206 has a core material 216 that comprises a conductive or semiconductive material, such as silicon. The core material of each read tip 222 is coated with an insulating coating 226, such as silicon dioxide, except at the sharp end of the read tip. The insulating coating and the core material at the sharp end of the tip are coated with a conductive coating 228, such as aluminum, gold, tungsten, or some other conductive material. To operate each read tip as an STM tip, controller 102 is electrically coupled to the conductive coating of the read tip.

Referring to FIG. 9, in a read mode, controller 102 first controls the XY translator apparatus in positioning the read probes over an area or region of storage medium 202 to be read. Since controller 102 is separately electrically coupled to the Z translator apparatus of each read probe 206, it can selectively and individually control the lowering of each read tip 222 in the Z direction close to the storage medium for reading data from the storage medium during the read mode. Moreover, since the controller is electrically coupled to storage medium 202 and separately coupled to conductive coating 228 of each read tip, it can selectively and individually produce and measure a tunneling current between the conductive coating of each read tip and the storage medium during the read mode. From the measured tunneling current, the controller determines the amount of deformation of the storage medium below the read tip so as to read a data bit or data value from the storage medium which was written during a previous write mode.

Furthermore, the read operation just described is similarly described in U.S. Pat. No. 5,038,322 referred to earlier and in U.S. Pat. Nos. 5,289,408 and 5,317,533 also referred to earlier and hereby explicitly incorporated by reference. Furthermore, since there are 33 read probes 206 in the embodiment of FIG. 9, up to 33 data bits or data values at a time may be read from storage medium 202 during a read mode in this manner.

In the embodiment of FIG. 9, each row of write and read probes 204 and 206 are spaced about 30 micrometers apart and the write and read probes in each row are also spaced about 30 micrometers apart. This is done to match the ranges of movement of the moveable support structures of X and Y translator assemblies 104 and 106 so as to maximize the amount of data that can be written to and read from storage medium 202 at nanometer level positioning increments over these ranges of movement.

Additionally, to enable data bits or data values written to storage medium to be erased, the deformable material of the storage medium 202 is capable of being heated to or near its melting point. As a result, in the area where the storage medium is being heated, it will be restored to its normal state and any deformations there representing data bits or data values will be removed.

In an erase mode, controller 102 controls the XY translator apparatus in positioning the read probes over an area or region of storage medium 202 to be erased. As indicated earlier, controller 102 is separately electrically coupled to the Z translator apparatus of each read probe 206 and can selectively and individually control the lowering of each read tip 222 in the Z direction close to the storage medium for erasing of data from the storage medium during the erase mode. Additionally, referring to FIG. 12, to also enable the erasing of data written to the storage medium, the controller is electrically coupled to core material 216 of each read probe 206 in that moveable support structure 166 and read probe 206 are integrally connected and comprise a conductive or semiconductive material.

Since the controller is separately electrically coupled to the conductive coating of each read tip, as discussed earlier, and is coupled to the core material 216 of each read tip, it can selectively and individually apply a voltage across the conductive coating and core material of each read tip during the erase mode. At the sharp end of each read tip 222, the conductive coating is in contact with the core material and a current is produced between them when the applied voltage across them reaches the forward bias point of the junction diode they form. Since the read tip has been lowered close to the storage medium during the erase mode, the heat generated by this flow of current radiates down toward storage medium 202 to heat the area of the storage medium below the read tip. This restores the storage medium in this area to its natural state and removes any deformation there so that a data bit or data value written to the storage medium during a previous write mode and represented by the deformation can be selectively and individually erased by the controller. Since there are 33 read probes 206 in the embodiment of FIG. 9, up to 33 data bits or data values at a time may be erased from storage medium 202 during an erase mode in the manner just described.

In an alternative embodiment, each read probe 206 would not have its own Z translator apparatus. Instead, each read probe would be connected to a large single Z translator apparatus which would be controlled by controller 102 to lower read tips 222 simultaneously together to perform in bulk the read and erase functions described earlier.

Figure 13:
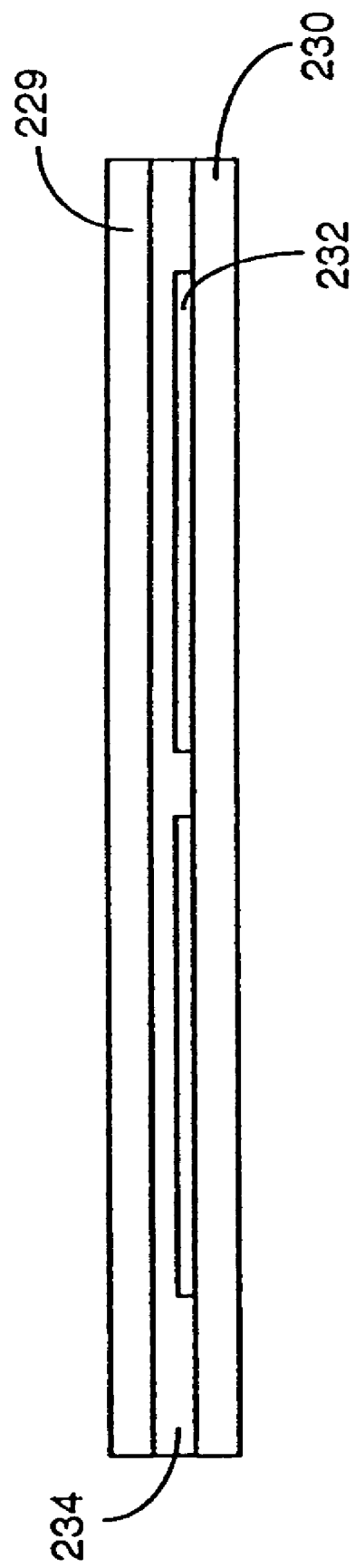
FIG. 13 shows a side cross sectional view of a storage medium capable of being used in the data storage device of FIG. 9.

Turning to FIG. 13, data bits or data values written to storage medium 202 may be erased in another way. In this embodiment, the storage medium comprises a layer of a deformable material 229, as described earlier, and a heater structure comprising a first insulating layer 230, one or more patterned conductive heater elements 232 over the first insulating layer, and a second insulating layer 234 over the first insulating layer and heater elements and below the deformable material.

Figure 14:
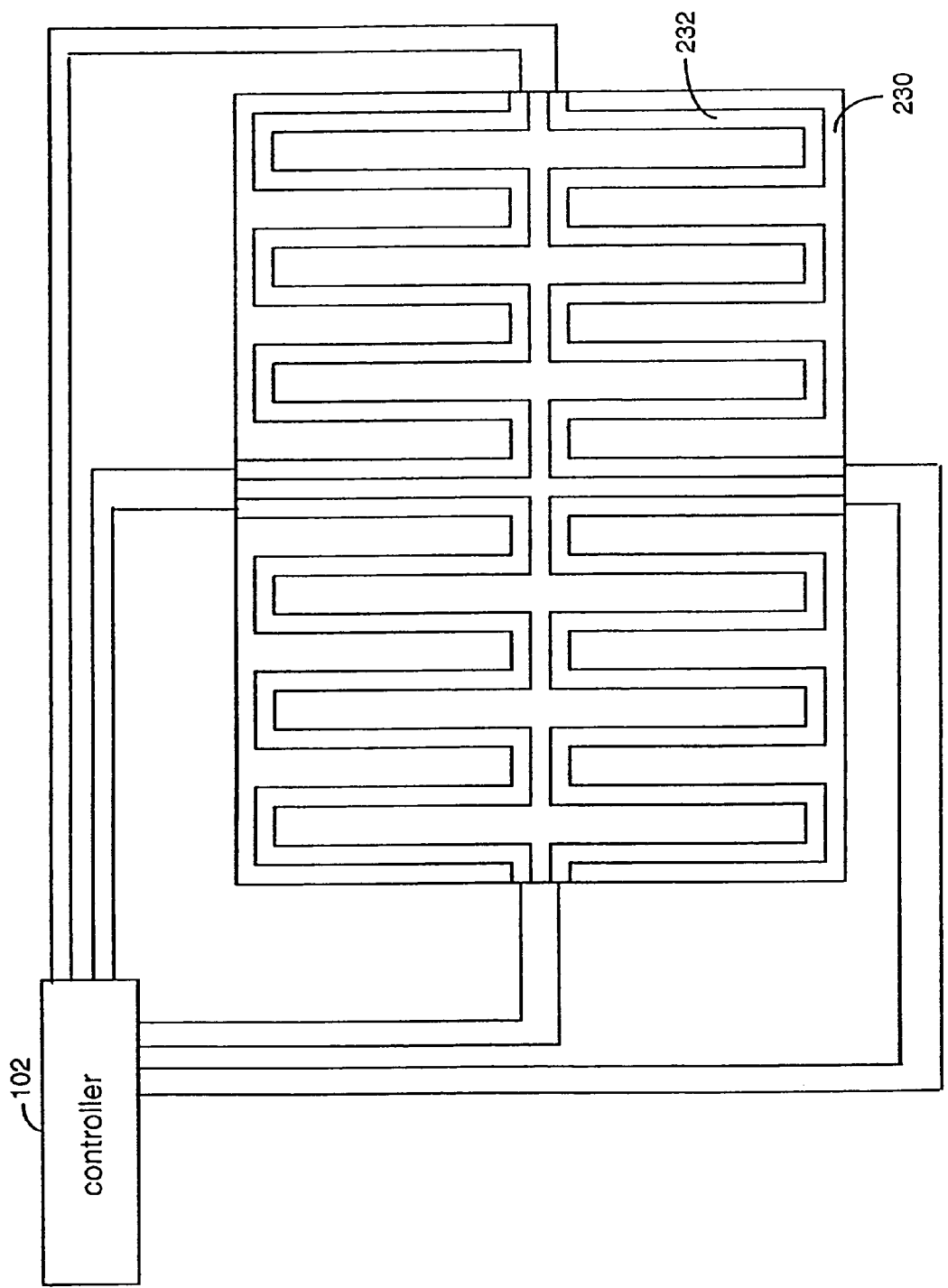
FIG. 14 shows top cross sectional view of the storage medium of FIG. 13.

FIG. 14 shows the patterned layout of heater elements 232. Controller 102 is separately electrically coupled across each heater element to selectively and individually apply across the heater element a voltage to heat the area (i.e., region) of storage medium 202 above the heater element. In doing so, controller 102 can selectively remove deformations in particular areas of the storage medium in a similar manner to that just described and therefore selectively erase data bits or data values written to these areas.

Turning again to FIG. 12, in an alternative embodiment, conductive coating 228 comprises an obdurate material, such as diamond, silicon carbide, or silicon nitride, made to be conductive using conventional doping techniques. For example, these materials may be doped with boron to make them conductive. In this embodiment, probes 206 could then be used not only to read data from storage medium 202 in the manner described earlier, but also write data to storage medium 202 in the manner described for write probes 204 of FIG. 10. Thus, only one kind of probe could be used in this embodiment to perform reading and writing of data to and from the storage medium.

Still referring to FIG. 12, in still another embodiment, the core material of read tips 222 would be conductive so that these tips would not require conductive coating 228 and insulating coating 226. In this case, the core material may comprise doped silicon, tungsten, aluminum, gold, or some other conductive material.

OPTICAL WRITE/ELECTRICAL READ EMBODIMENT

Figure 15:
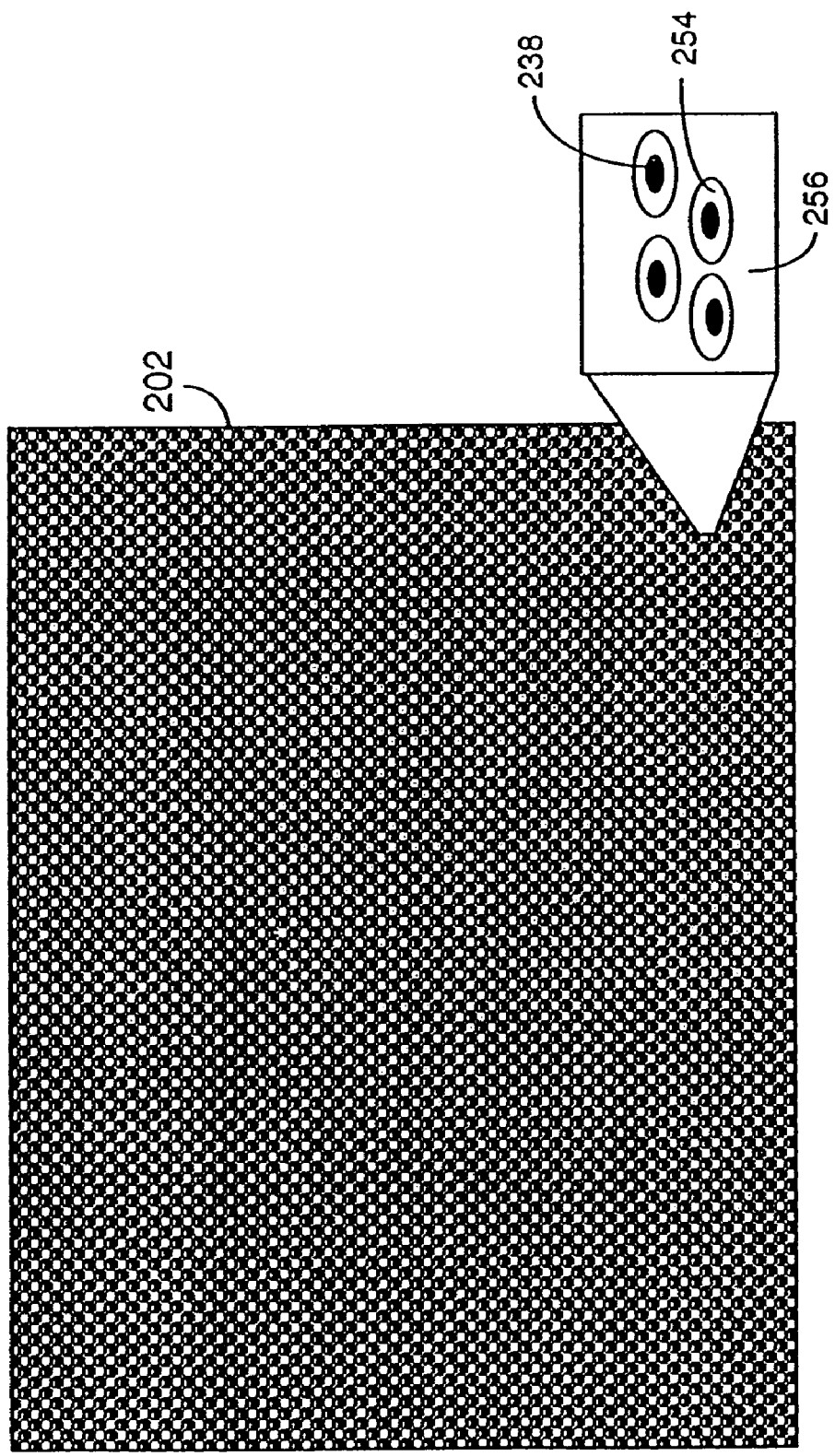
FIG. 15 shows another storage medium capable of being used in the data storage device of FIG. 9.
Figure 16:
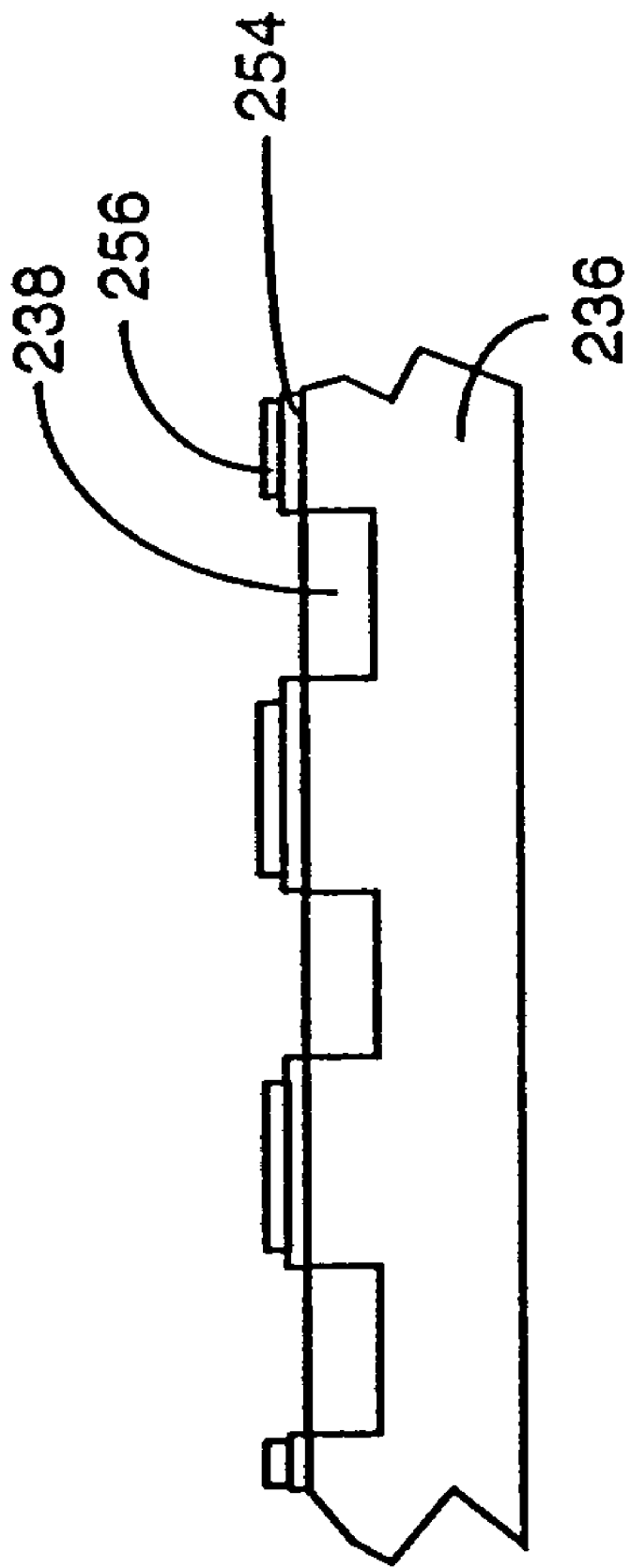
FIG. 16 shows a side cross sectional view of the storage medium of FIG. 15.

Referring to FIGS. 15 and 16, in another embodiment of data storage device 200, storage medium 202 comprises optically alterable charge storage cells, regions, or areas of the type used in UV erasable programmable read only memories (UVPROMs). However, in this case, these charge storage cells do not have individual read/write lines. To provide the charge storage cells, the storage medium comprises a silicon substrate 236 in which are formed electrically isolated, spaced apart, and conductively doped wells 238 capable of storing a charge. Controller 102 is electrically coupled to the substrate so that it is electrically coupled to each doped well that forms the charge storage cells.

Moreover, referring to FIG. 9, write probes 204 of the read/write mechanism are constructed to optically write data to the charge storage cells of storage medium 202 while read probes 206 are constructed to electrically read the data optically written to the charge storage cells. Otherwise, the data storage device in this embodiment is constructed and operates the same as the one of the mechanical write/electrical read embodiment discussed earlier.

Figure 17:
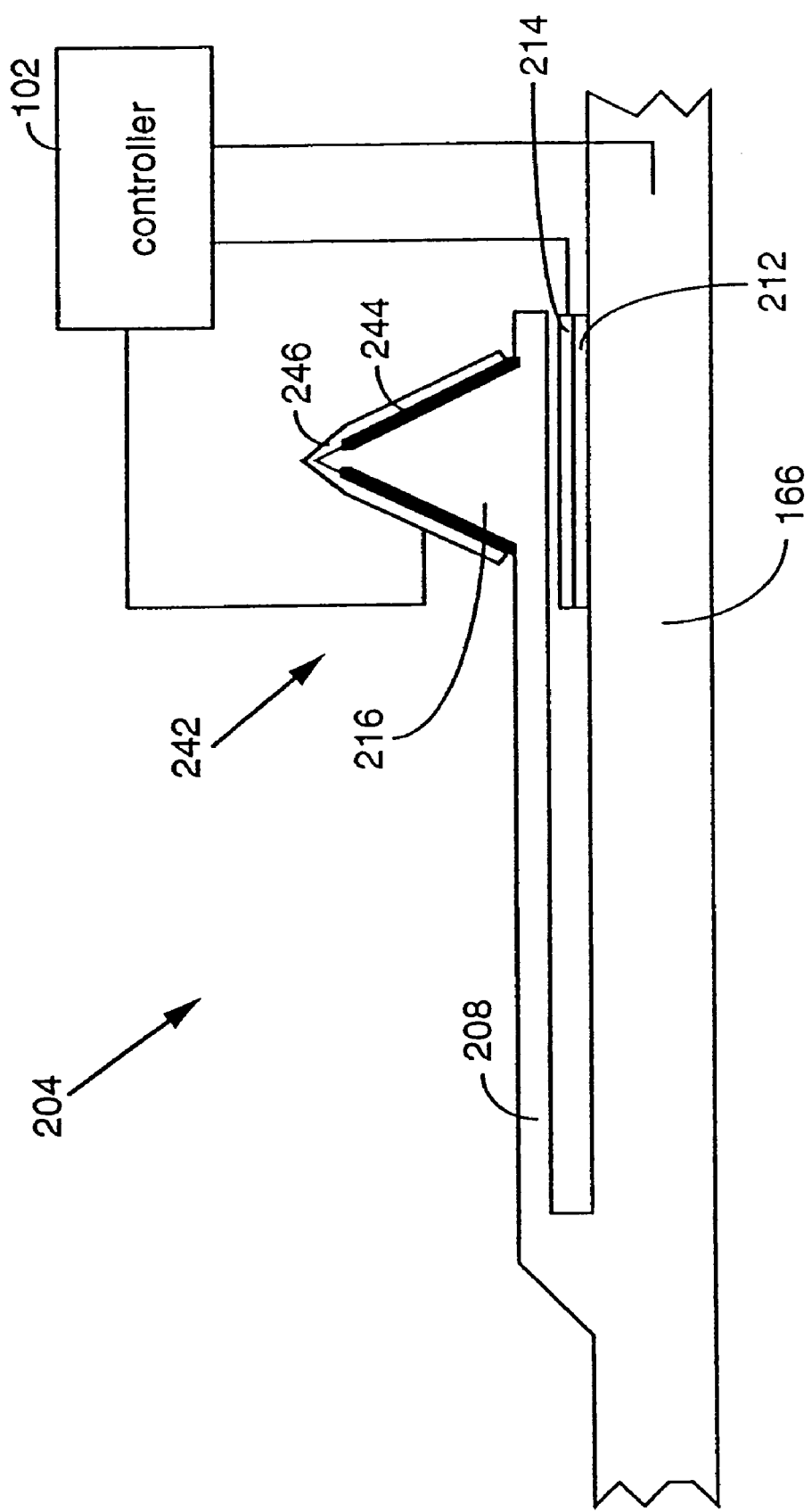
FIG. 17 shows another write probe capable of being used in the data storage device of FIG. 9.

FIG. 17 shows the construction of each write probe 204 of this embodiment. Like the write probes of the embodiment of FIG. 10, each write probe has a conductive or semiconductive core material 216, such as silicon. The core material of each write tip 242 is coated with an emissive coating 244 at a thickness of approximately 10 to 200 nanometers. This emissive coating may comprise gallium nitride, gallium arsenide, or silicon carbide all suitably doped to be emissive. A conductive coating 246, such as aluminum, gold, tungsten, indium tin oxide, or some other conductive material, is over the emissive coating and has a thickness of approximately 20 to 200 nanometers. About 5 to 10 nanometers of the conductive coating at the sharp end may be made sufficiently thin so that it is transparent to blue and/or UV light or about 5 to 10 nanometers of the conductive coating can removed or rubbed off from the sharp end of the write tip. This forms an aperture at the sharp end of the tip with a diameter in the range of approximately 5 to 100 nanometers. With a voltage of about 4 volts applied across the conductive coating and core material, blue (e.g., 423 nanometer wavelength) and/or ultraviolet (UV) light (e.g., 372 nanometer wavelength) is emitted by emissive coating 240 as described in Deposition, Characterization, and Device Development in Diamond, Silicon Carbide, and Gallium Nitride Thin Films referenced earlier. The light propagates through the write tip until it is emitted at its sharp end at the aperture which has a diameter substantially smaller than the wavelength of the light. This type of probe is even further described in the copending U.S. patent application Ser. No. 08/281,883 referenced earlier.

Figure 18:
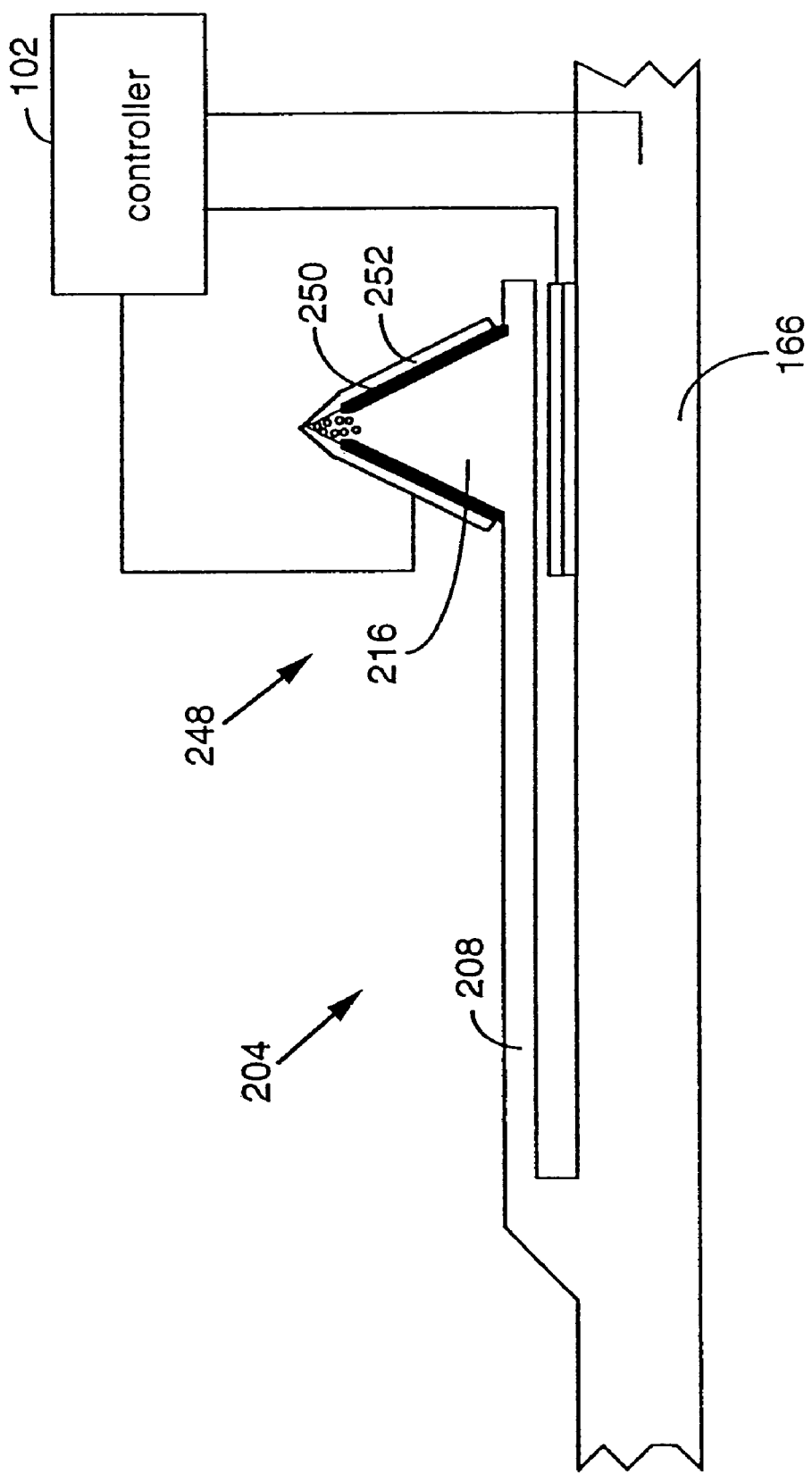
FIG. 18 shows still another write probe capable of being used in the data storage device of FIG. 9.

In an alternative embodiment shown in FIG. 18, each write probe 204 is comprised of a silicon core material 216. The silicon core material at the sharp end of each write tip 248 is porous. This is accomplished by immersing the write probe in a dilute solution of Hydrofluoric acid or a dilute solution Hydrofluoric and Nitric acid and operating the silicon write probe as an anode. In addition, a gold or platinum cathode is also immersed in the solution. A current is then produced between the anode and cathode which is sufficient to porously etch the sharp end of the write tip (and other sharp edges of the write probe) but leave the remainder of the write probe unetched. The silicon core material of each write tip is coated with an insulating coating 250, such as silicon dioxide, except at the sharp end of the read tip. The insulating coating and the porous core material at the sharp end of the tip are coated with a conductive coating 252, such as aluminum, gold, tungsten, indium tin oxid, or some other conductive material. To form an aperture at the sharp end of the tip, about 5 to 10 nanometers of the conductive coating at the sharp end may be made sufficiently thin so that it is transparent to light or about 5 to 10 nanometers of the conductive coating can removed or rubbed off from the sharp end of the write tip.

Controller 102 is electrically coupled to core material 216 of each write probe 248 in that moveable support structure 166 and write probe 248 are integrally connected and comprise silicon. Moreover, the controller is separately electrically coupled to conductive coating 252 of each write tip 248. Thus, the controller can selectively and individually apply a voltage across the conductive coating and core material of each read tip. Since at the sharp end of each write tip the conductive coating is in contact with the porous core material, a current can be produced between them when the voltage is applied which causes the porous core material at the sharp end to emit light through the aperture of the write tip.

Alternatively, write tip 248 may be uncoated. In this embodiment, controller 102 may be electrically coupled across core material 216 of each write tip and substrate 230 of storage medium 202. By selectively and individually applying a voltage across them, a current will be produced between the charge storage cell close to the write tip and the write tip which causes the porous core material at the sharp end of the write tip to emit light.

Light emission by porous silicon is further described in An Improved Fabrication Technique for Porous Silicon, Review of Scientific Instruments, v64, m2 507-509 (1993), Photoluminescence Properties of Porous Silicon Prepared by Electrochemical Etching of Si Epitaxial Layer, Act. Physics Polonica A, v89, n4, 713-716 (1993), Effects of Electrochemical Treatments on the Photoluminescence from Porous Silicon, Journal of the Electrochemical Society, v139, n9, L86-L88 (1992), Influence of the Formation Conditions on the Microstructure of Porous Silicon Layers studied by Spectroscopic Ellipsometry, Thin Solid Films, v255, n1-2; 5-8 (1995), and Formation Mechanism of Porous Si Layers Obtained by Anodization of Mono-Crystalline N-type Si in HF Solution and Photovoltaic Response in Electrochemically Prepared Porous Si, Solar Energy Materials and Solar Cells, v26, n4, 277-283. which are hereby explicitly incorporated by reference.

Furthermore, referring to FIG. 9, in a write mode, controller 102 first controls the XY translator apparatus in positioning write probes 204 over charge storage cells to be written. As discussed earlier, controller 102 is separately electrically coupled to the Z translator apparatus of each write probe 204 and can selectively control the lowering of each write tip 242 in the Z direction to write data to a charge cell during the write mode. Moreover, as shown in FIGS. 17 and 18, controller 102 is separately electrically coupled to each write probe to make it emit light. Thus, during a write mode, the controller can selectively and individually control each write tip to write a data bit or data value to a charge storage cell by emitting a selected predetermined amount of light close to a charge cell in the manner just described to cause a selected predetermined amount of charge in the charge storage cell to be optically leaked off, altered, or changed so that the charge storage cell stores a selected predetermined amount of charge representing the data bit or data value.

Specifically, in an embodiment for writing binary bits of digital data with each write tip, a data bit of value "1" and a data bit of value "0" are represented by two different predetermined amounts of charge in a charge cell. Thus, for example, a data bit of value "0" may be represented by a specific charge amount that has been optically changed and a data bit of value "1" may be represented by a specific charge amount that has not been optically changed. However, in an embodiment for writing a larger range of digital data values with each write tip, a range of predetermined charge amounts represent a range of digital data values. Thus, for example, the range of predetermined charge amounts may range from no charge representing a minimum data value to a maximum amount of charge representing a maximum data value. Since there are 33 write probes, up to 33 data bits or data values can be written to up to 33 charge storage cells during a write mode in the manner just described.

Referring to FIG. 12, read probes 206 in this embodiment may be constructed in the same way as those of the mechanical write/electrical read embodiment described earlier. Thus, in a read mode, controller 102 controls the XY translator apparatus in positioning the read probes over charge storage cells to be read. And, as described earlier, controller 102 is separately electrically coupled to the Z translator apparatus of each read probe 206 and can individually and selectively control the lowering of each read tip 222 in the Z direction to detect with the conductive coating of the read tip a charge in a charge storage cell of storage medium 202. Moreover, since the controller is also separately coupled to conductive coating 228 of each read tip, it can individually and selectively measure the amount of the detected charge so as to read a data bit or data value from the charge storage cell which was written during a previous write mode. In other words, the read tip is used to detect the predetermined amount of alteration of the charge storage cell caused during a write mode and the controller measures the detected amount to read the data bit or data value written during the write mode. Since there are 33 read probes, up to 33 data bits or data values at a time during a read mode can be read in this manner from up to 33 charge storage cells.

Furthermore, referring to FIGS. 15 and 16, as indicated previously the charge storage cells are of the type found in UVPROMs. However, read/write lines are eliminated such that the charge storage cells may be made much smaller and spaced much closer than in conventional UVPROMs. As a result, in this embodiment, the size of the charge storage cells may be on the nanometer level and the charge storage cells may be spaced apart at nanometer level increments. This is so that data can be written to and read from storage medium 202 at nanometer level increments of positioning using X and Y translator assemblies 104 and 106 of FIGS. 1 and 9 in the manner described earlier.

Additionally, the typical standard energy from common UV sources used to erase UVPROMs is on the order of 10-9 watts per micrometer. However, light emitting tips 242 and 248 described herein will easily produce UV energy at a near-field intensity of 107 to 108 times more intense which results in write times on the order of 1 to 10 microseconds.

Furthermore, during an erase mode, controller 102 controls the XY translator apparatus in positioning read probes 206 over charge storage cells to be erased. Since controller 102 is separately electrically coupled to the Z translator apparatus of each read probe 206, it can individually and selectively control the lowering of each read tip 222 in the Z direction close to storage medium 202 for erasing of data from a charge storage cell during the erase mode. Moreover, referring to FIGS. 12 and 16, as discussed earlier, the controller is separately electrically coupled to conductive coating 228 of each read tip and is electrically coupled to substrate 236 of the storage medium. Thus, it can individually and selectively apply a selected predetermined voltage across the conductive coating of each tip and the charge storage cell under the tip during the erase mode. Since the read tip is lowered close to the charge storage cell during the erase mode, this results in a selected predetermined amount of tunneling current being produced between the conductive coating and the charge storage cell so that a selected predetermined amount of charge is injected or transferred into the charge storage cell. Thus, the charge in the charge storage cell is restored to this predetermined amount so that it can be changed in a subsequent write mode when again writing a data bit or data value to the charge storage cell. Since there are 33 read probes 204, up to 33 data bits or data values may be erased at a time during an erase mode from up to 33 charge storage cells in the manner just described.

Referring to FIGS. 15 and 16, data bits or data values written to the charge storage cells of storage medium 262 may also be eased in another way. Specifically, the storage medium also includes an insulating layer 254 around doped wells 238. Over the insulating layer are one or more patterned conductors 256 around one or more corresponding areas or regions of the doped wells.

Controller 102 is separately electrically coupled across each conductor and the silicon substrate to selectively and individually apply across them a predetermined voltage. This produces a selected predetermined amount of tunneling current between the conductor and the charge storage cells in the corresponding selected region and injects a selected predetermined amount of charge into these charge storage cells. As a result, any data bits or data values written to these charge storage cells during a previous write mode are erased in a similar manner to that just described.

In alternative embodiments, the storage medium may comprise other types of materials or structures which can be optically altered at discrete increments, regions, or intervals by light emissions from the types of write probes 204 discussed next.

In an additional alternative embodiment, each write and read probe 204 and 206 would not have its own Z translator apparatus. Instead, each write probe would be connected to a large single Z translator apparatus which would be controlled by controller 102 to lower write tips 242 or 248 simultaneously together to perform in bulk the write function described earlier. Moreover, each read probe would also be connected to a large single Z translator apparatus which would be controlled by controller 102 to lower read tips 222 simultaneously together to perform in bulk the read and erase functions described earlier.

Referring to FIGS. 9 and 18, in still another alternative embodiment, instead of being used as a data storage device, device 200 could be used as a biochemical instrument. In this case, the biochemical instrument includes one or more probes 204 each having a tip 248 with a porous sharp end, as described earlier, but without insulating and conductive coatings 250 and 252. Specifically, by controlling the etch current and etch time of the process described above, the pore width and depth of a region of several angstroms in length at the sharp end of the tip can be controlled. As a result, binding cites of a specific size for selected molecules can be made in the tip at the sharp end so that controller 102 could control the lowering and raising of the tip, in the manner described earlier, into and from a biochemical substance to biochemically interact with it.

For example, a tip of this embodiment which holds specific types of molecules in its binding cites could be lowered into and out of an assay for viruses or other bioactive chemicals or biostructures to deposit them into or remove them from the assay. Similarly, a tip that holds in its binding cites the molecules of a catalytic chemical may be lowered into a substance to produce a catalytic reaction in the substance. Or, the tip may be lowered into and raised from a biochemical substance, such as a cell, to attract and pick up specific molecules at the binding cites of the tip. Additionally, the binding sites may hold the molecules of a chemically active material so that when the tip is lowered into an unknown sample of organic or inorganic material, the binding energy or attractive force between the molecules of the chemically active and sample materials can be measured by the deflection of cantilever 208 to characterize the sample material. In this case, the deflection of the cantilever would be determined by the controller by measuring changes in the energy storage of the capacitor described earlier (formed by the moveable support structure 166, insulating layer 212, and conductive layer 214) or with a laser and photodetector assembly like in a conventional AFM and described further in the copending U.S. patent application Ser. No. 08/281,883 referenced earlier.

ELECTRICAL WRITE/READ EMBODIMENT

Referring to FIGS. 15 and 16, in another embodiment of data storage device 200, storage medium 202 comprises charge storage cells, regions, or areas similar to the UVPROM type charge storage cells of the optical write/electrical read embodiment described earlier and of the type used in electronically erasable programmable read only memories (EEPROMs). However, like the UVPROM type charge storage cells, they do not have read/write lines and are constructed similar to the UVPROM type storage cells.

Referring to FIG. 12, in this embodiment, data storage device uses only probes 206 of the type described in the mechanical write/electrical read embodiment. These probes are used to electrically read and erase data from the charge storage cells in a similar manner to that discussed earlier. Moreover, they are also used to electrically write data to the charge storage cells which is done in a similar fashion to the way in which data is erased from the charge storage cells. However, in this case, a predetermined amount of charge of opposite polarity to the charge injected during an erase mode is injected into a charge storage cell to change the charge stored by the charge storage cell and write to it a data bit or data value. In other words, In other words, the charge storage cell is electrically altered by a predetermined amount to write data to it. Otherwise, this write operation is the same as the erase operation discussed earlier and is further described in U.S. Pat. Nos. 5,289,408 and 5,317,533.

Furthermore, like the UVPROM type storage cells discussed earlier, the size of the EEPROM type charge storage cells may be at the nanometer level and they may be spaced apart at nanometer level increments since they do not require address lines and read/write lines. Thus, in this embodiment as well, data can be written to and read from storage medium 202 at nanometer level increments of positioning using X and Y translator assemblies 104 and 106 of FIGS. 1 and 9 in the manner described earlier.

In alternative embodiments, the storage medium may comprise other types of materials or structures which can be electrically altered at discrete increments, regions, or intervals by tunneling currents from the types of probes 206 discussed next. These types of materials or structures may include magnetic materials or the types of materials and structures as described in U.S. Pat. Nos. 5,289,408 and 5,317,533 referred to earlier.

ACOUSTICALLY AIDED ELECTRICAL WRITE/READ EMBODIMENT

Figure 19:
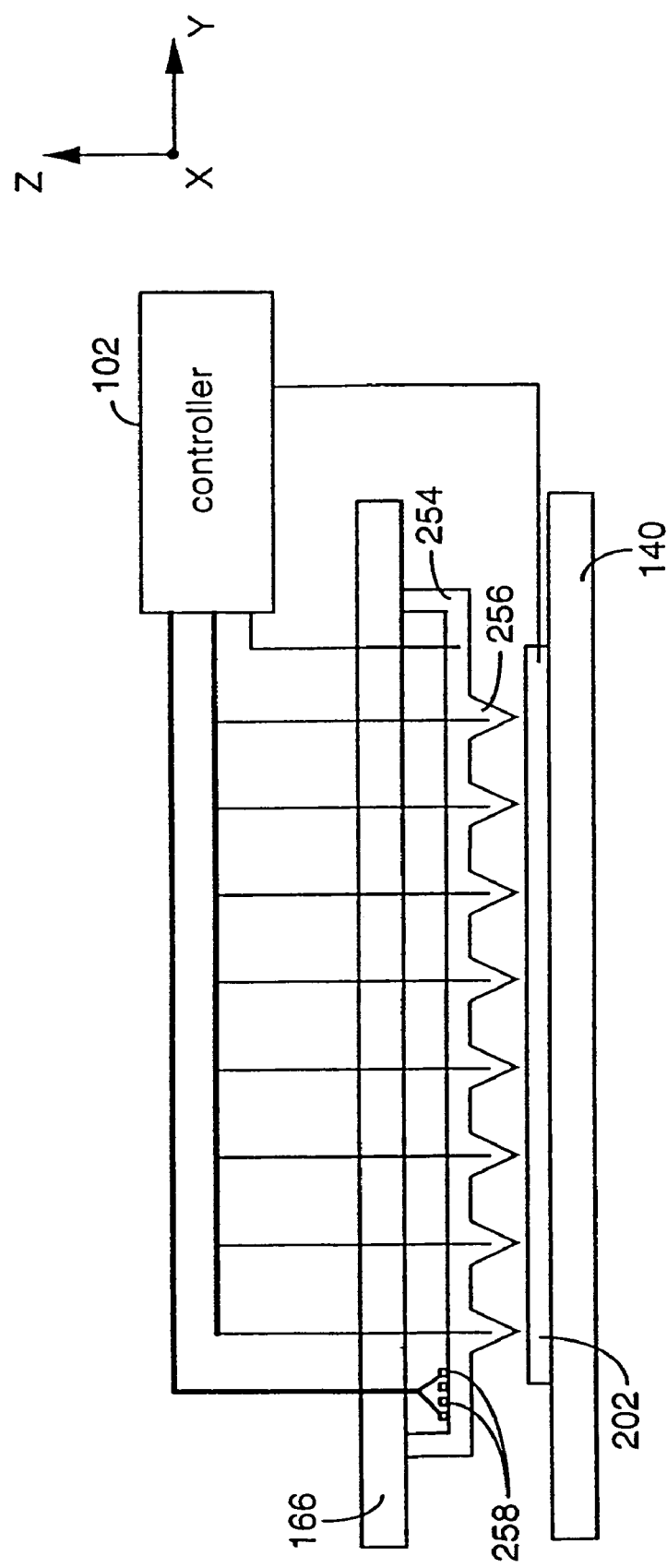
FIG. 19 shows another embodiment of the read/write mechanism of FIG. 9.
Figure 20:
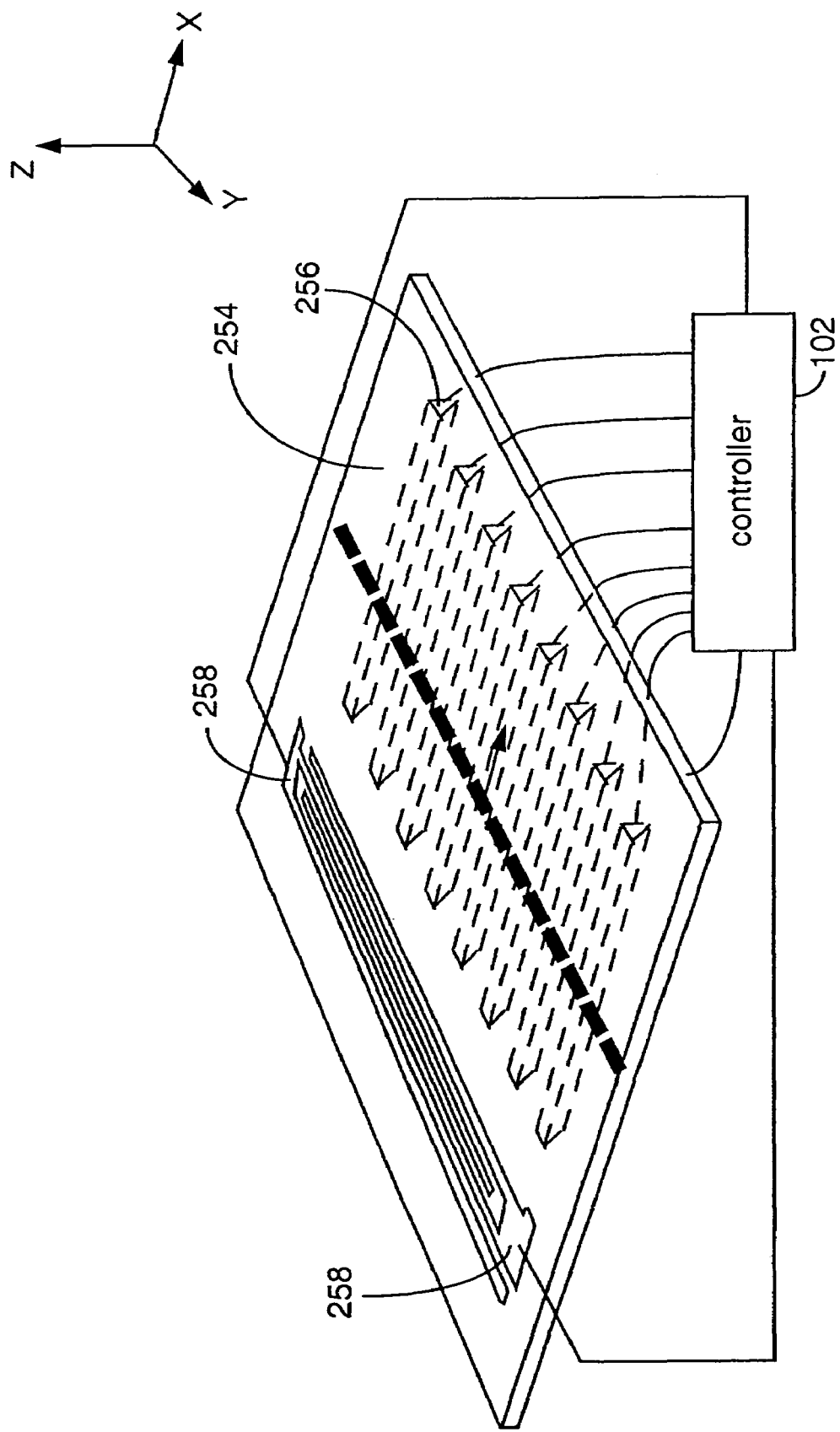
FIG. 20 provides another view of the read/write mechanism of FIG. 19.

Referring to FIGS. 15 and 16, in another embodiment of data storage device 200, storage medium 202 also comprises the EEPROM type charge storage cells described earlier for the electrical write/read embodiment. Furthermore, referring to FIGS. 19 and 20, in this embodiment, the write and read probes 204 and 206 described earlier are replaced by a write/read mechanism that operates similarly to the probes 206 of the electrical write/read embodiment but is acoustically aided. The acoustically aided electrical write/read mechanism comprises a ridge support structure 254, one or more parallel triangular ridges 256 integrally connected to the base support structure, and an acoustic wave generator on the ridge support structure comprising two interleaved piezoelectric transducers or actuators 258. The storage medium and acoustically aided electrical write/read mechanism can be positioned with respect to each other in the ways described earlier.

Triangular ridges 256 extend down from the flat lower surface of ridge support structure 254. The triangular ridges are constructed similarly to tips 222 of FIG. 12 in that each has a conductive or semiconductive core material, such as silicon, integrally connected to the ridge support structure, an insulating coating over the core material except at the sharp end of the ridge, and a conductive coating over the insulating coating and the core material at the sharp end. Moreover, controller 102 is also separately electrically coupled to the conductive coating of each of the triangular ridges.

Referring back to FIGS. 19 and 20, piezoelectric transducers 258 of the acoustic wave generator are positioned on the flat upper surface of ridge support structure 254 so as to generate surface acoustic waves 255 that propagate on the upper surface in the X direction and parallel to the axial length of the triangular ridges in the Y direction. Controller 102 is electrically coupled to the piezoelectric transducers to generate a surface acoustic wave during each write, read, and erase mode.

During a write mode, controller 102 first controls the XY translator apparatus in positioning triangular ridges 258 over corresponding charge storage cells to be written. Then, the controller controls the acoustic wave generator in generating an acoustic wave that propagates on the surface of the ridge support structure parallel to the axial lengths of the triangular ridges. To write a data bit or data value to a particular charge storage cell under each triangular ridge, controller 102 selectively and individually applies a write voltage pulse of a selected predetermined voltage across the conductive coating of the triangular ridge and the substrate of storage medium 202 at a selected predetermined time and for a selected predetermined time interval or duration during the propagation of the acoustic wave. The predetermined time corresponds to the location of the charge storage cell because at this predetermined time the portion of the ridge support structure over the charge storage cell is displaced by the propagating surface acoustic wave down toward the charge storage cell so that the portion of the triangular ridge connected to this portion of the ridge support structure is also displaced down toward the charge storage cell. As a result, the predetermined voltage of the write voltage pulse over the predetermined time interval produces a selected predetermined amount of tunneling current between the conductive coating of the triangular ridge and the charge storage cell. Thus, a charge of a selected predetermined amount is injected into the charge storage cell so that a data bit or data value is written to it in a similar manner to that described earlier in the electrical write/read embodiment. In other words, the charge storage cell is electrically altered by a predetermined amount.

For example, the speed of a surface acoustic wave in ridge support structure 254 may be about 1000 meters/sec (typical for semiconductive materials). Thus, if the storage medium includes 1000 charge storage cells under a triangular ridge over a 1 millimeter distance along the propagation direction of an acoustic wave, then the acoustic wave would traverse each charge storage cell in 1 nanosecond. In order to write a data bit or data value to the 500th charge storage cell under a particular triangular ridge, a write voltage pulse would be applied across the conductive coating of the triangular ridge and the substrate of the storage medium for a 1 nanosecond time interval 500 nanoseconds after the wave front of the acoustic wave first begins propagating over the triangular ridge. Since there are 8 triangular ridges in the embodiment of FIGS. 19 and 20, up to 8 data bits or data values can be written at a time during a write mode to up to 8 charge storage cells in the manner just described.

Similarly, in a read mode, controller 102 controls positioning of triangular ridges 258 over corresponding charge storage cells to be read and controls the acoustic wave generator in generating an acoustic wave. Controller 102 then measures the amount of the charge detected by the conductive coating of each triangular ridge at a selected predetermined time and for a selected predetermined time interval during the propagation of the acoustic wave. As in the write mode, the predetermined time corresponds to the location of the charge storage cell so that at this predetermined time the triangular ridge is displaced down toward the charge storage cell in the manner described earlier and the conductive coating of the triangular ridge detects the charge of the charge storage cell. As a result, a data bit or data value is read from the charge storage cell in a similar manner to that described earlier in the optical write/electrical read and electrical write/read embodiments. In other words, the triangular ridge is used to detect the predetermined amount of electrical alteration of the charge storage cell during a write mode and the controller measures the detected amount to read the data bit or data value written during the write mode. Up to 8 data bits or data values can be read at a time during a read mode from up to 8 charge storage cells in the manner just described since there are 8 triangular ridges in the embodiment of FIGS. 19 and 20.

Additionally, in an erase mode, data bits or data values are erased in a similar fashion to which they are written. However, during the erase mode, a predetermined amount of charge of opposite polarity to the charge injected during an erase mode is injected into a charge storage cell to change the charge stored by the charge storage cell and erase a data bit or data value written during an earlier write mode.

Controller 102 adjusts the timing and duration of the write and erase voltage pulses during write and erase modes and the timing and duration of the charge detection during a read mode to corresponding to changes in temperature. As a result, the position in the storage medium over which a read or write is done always remains constant regardless of temperature change.

Furthermore, bulk erasing may also be performed in the same manner as described earlier in the optical write/electrical read and electrical write/read embodiments.

In an alternative embodiment, the acoustic wave generator may be positioned instead on the upper surface of storage medium 202. As in the embodiment where it is positioned on ridge support structure 254, it would be positioned so that the acoustic waves it generates propagate in a direction parallel to the axial length of triangular ridges 256. As a result, the charge storage cells would be displaced rather than the triangular ridges in positioning the triangular ridges close to the charge storage cells to write, read, and erase data in the ways described earlier.

In other alternative embodiments, the core material of triangular ridges 256 would be conductive so that these tips would not require a conductive coating and an insulating coating. In this case, the core material may comprise doped silicon, tungsten, aluminum, gold, or some other conductive material. Moreover, the storage medium could comprise an electronically alterable material or structure of the type also described in the electrical write/read embodiment.

Similar to the read and write probes 204 and 206 of the earlier discussed embodiments, triangular ridges 256 could be spaced about 30 micrometers apart. Referring to FIG. 9, this is done to match the range of movement of the moveable support structure of Y translator assembly 106 so as to maximize the amount of data that can be written to and read from storage medium 202 at nanometer level positioning increments over this range of movement.

Figure 21:
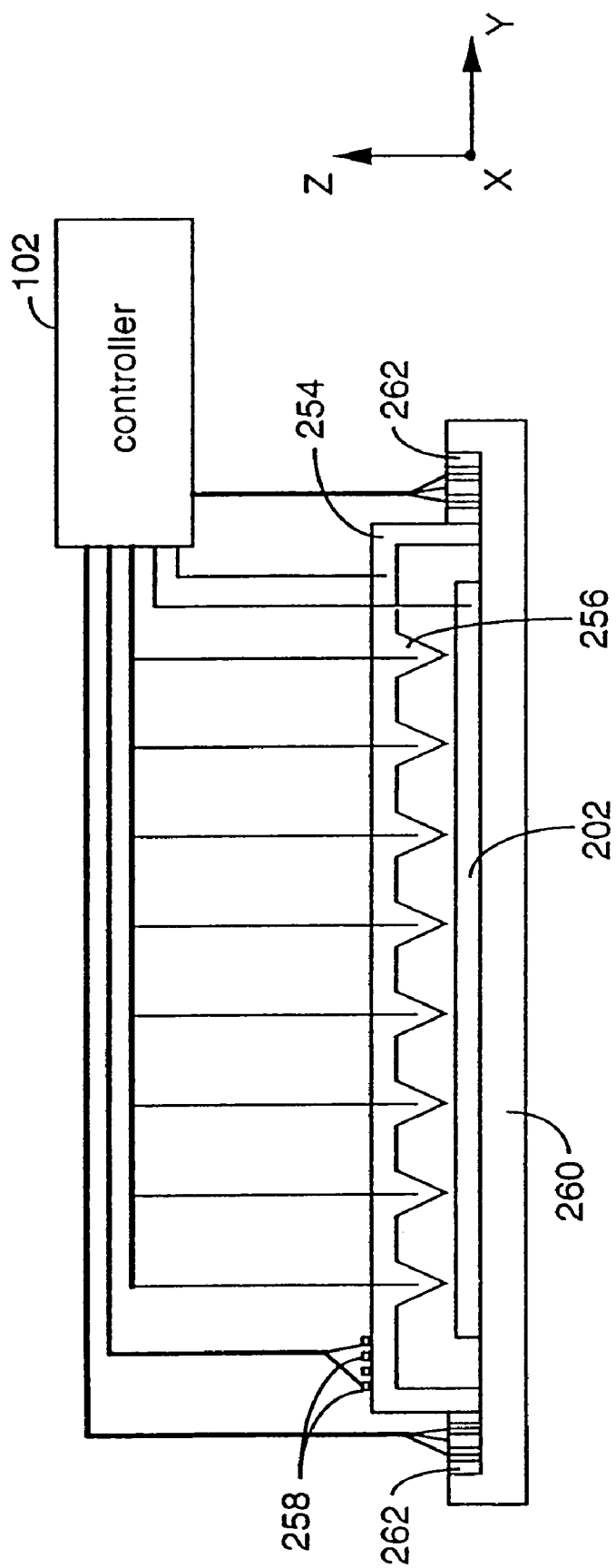
FIG. 21 shows another embodiment of the read/write mechanism of FIG. 19.
Figure 22:
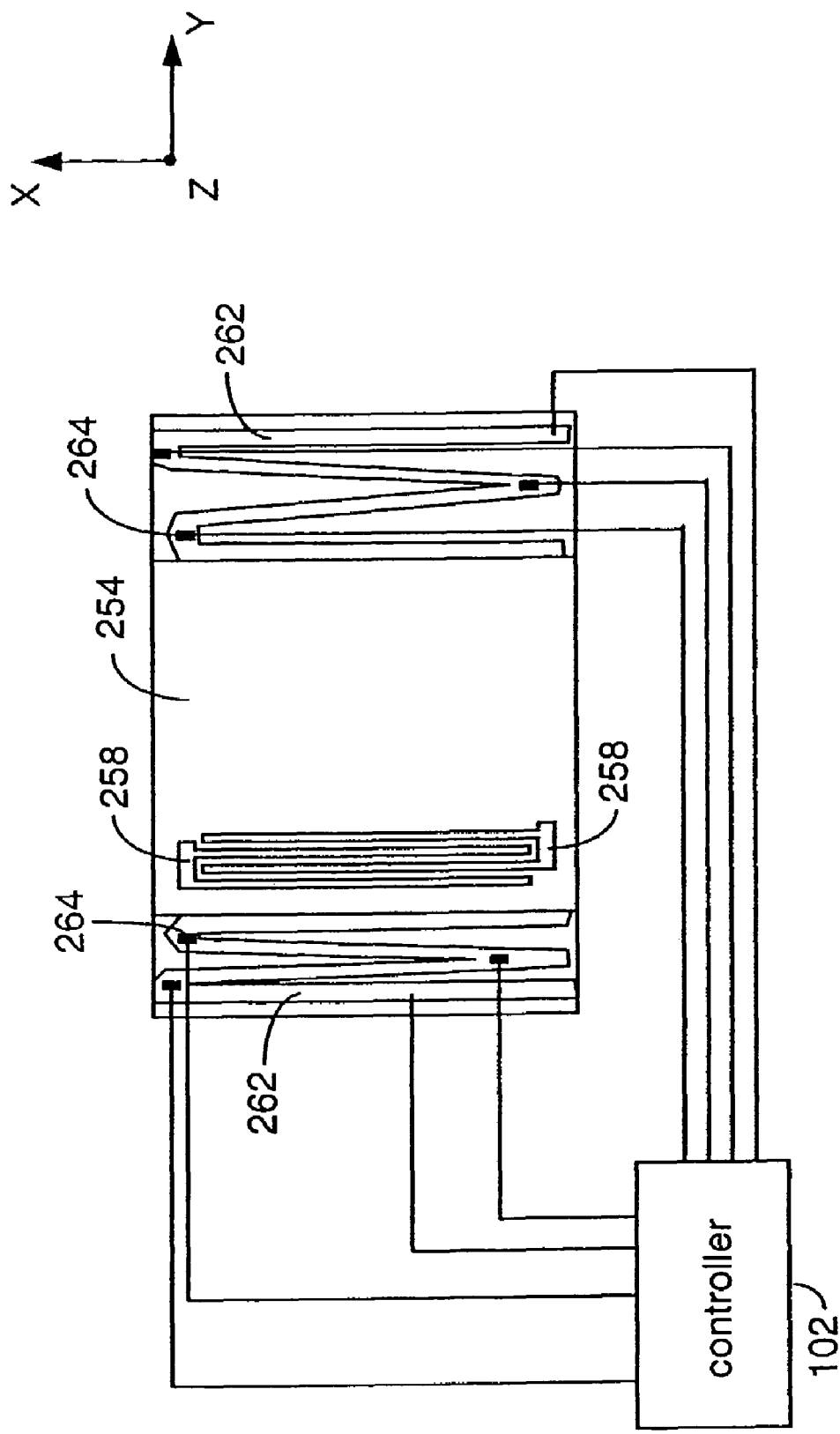
FIG. 22 shows a top view of the read/write mechanism of FIG. 21.

Finally, positioning of storage medium 202 and the acoustically aided electrical write/read mechanism could be alternatively accomplished as shown in FIGS. 21 and 22. In this case, a Y translator apparatus that comprises a stationary support structure 260, a pair of thermally expandable and contractible structures 262, and heater elements 264 is used to position the triangular ridges over charge storage cells in the Y direction (i.e., orthogonal to the direction of propagation of the surface acoustic waves generated by the acoustic wave generator).

In this embodiment, storage medium 202 is fixedly coupled to stationary support structure 260 and ridge support structure 254 has vertical end portions that rest on but are not directly connected to the stationary support structure. Each of the end portions is integrally connected to a corresponding thermally expandable and contractible structure 262. The thermally expandable and contractible structures are both integrally connected to the stationary support structure. Heater elements 264 are located at the elbows of the thermally expandable and contractible structures and are used to selectively heat the thermally expandable and contractible structures so that they thermally expand and contract and move back and forth in the Y direction. Thus, the thermally expandable and contractible structures movably couple the stationary support structure to the ridge support structure in a way similar to that described earlier in which thermally expandable and contractible structure 132 movably couples the stationary support structure and the moveable support structure of the X translator assembly 104 of FIG. 2.

Furthermore, in this embodiment, to control the heater drive just described, controller 102 is electrically coupled to heater elements 264 and thermally expandable and contractible structures 262 to provide a current that flows through the heater elements. By controlling the amount of current that flows through the heater elements, the controller can control positioning of ridge support structure 254 in nanometer level increments in the Y direction in a similar manner to that described earlier for the embodiment of FIG. 1.

Alternatively, the vertical end portions of ridge support structure 254 could be fixedly coupled to stationary support structure 260. In this case, storage medium 202 would be movably coupled to the stationary support structure 260 by thermally expandable and contractible structures like those just discussed and positioning of the storage medium in the Y direction would be accomplished similarly to that just discussed.

Furthermore, in still other embodiments, piezoelectric transducers, like those discussed for X translator assembly 104 of FIG. 3, could be used in place of the thermally expandable and contractible structures and heater elements in the embodiments just discussed. Their movement would be accomplished in a similar way to that discussed for the X translator assembly of FIG. 3.

CONCLUSION

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is;:

1. A data storage device comprising:
   a deformable storage medium adapted to store data in the form of one or more indentations mechanically impressed thereon;
   a plurality of heat probes for supplying heat to the deformable storage medium;
   a probe positioning apparatus to position the plurality of heat probes with respect to the storage medium; and
   a controller configured to (A) during an erase mode, control the probe positioning apparatus in positioning a given one of the heat probes proximate a first of the one or more indentations, and (B) during the erase mode, cause the given one of the heat probes to heat the storage medium to or near its melting point so that the first indentation in the storage medium is removed and the data is erased.

2. The data storage device of claim 1 in which the storage components are operated in a vacuum.

3. The data storage device of claim 1 in which the storage components are operated in an inert gas.

4. A data storage device for use with a deformable storage medium having stored data in the form of one or more indentations mechanically impressed thereon, the data storage device comprising:
   a plurality of heat probes for supplying heat to the deformable storage medium;
   a probe positioning apparatus to position the plurality of heat probes with respect to the storage medium; and
   a controller configured to (A) during an erase mode, control the probe positioning apparatus in positioning a given one of the heat probes proximate a first of the one or more indentations, and (B) during the erase mode, cause the given one of the heat probes to heat the storage medium to or near its melting point so that the first indentation in the storage medium is removed and the data is erased.

5. The data storage device of claim 4 in which the storage components are operated in a vacuum.

6. The data storage device of claim 4 in which the storage components are operated in an inert gas.

7. A data storage device comprising:
   a deformable storage medium;
   a plurality of probes each comprising:
   a tip comprising a conductive highly obdurate coating capable of deforming the storage medium, and
   a tip positioning apparatus to lower the tip;
   a plurality of heat probes for supplying heat to the deformable medium; and
   a probe and storage medium positioning apparatus to position the probes over the storage medium; and
   a controller to (A) during a write mode, control the probe and storage medium positioning apparatus in positioning the probes over the storage medium, (B) during the write mode, control each tip positioning apparatus in lowering the corresponding tip a predetermined amount into the storage medium so as to cause a predetermined amount of mechanical deformation in the storage medium representing data written thereto, (C) during read mode, control the probe and storage medium positioning apparatus in positioning the probes over the storage medium, (D) during the read mode, control each tip positioning apparatus in lowering the corresponding tip close to the storage medium, and (L) during the read mode, produce and measure a tunneling current between the conductive obdurate coating of each tip and the storage medium to identify a predetermined amount of deformation caused in the storage medium below the corresponding tip during the write mode so that the data written thereto is read therefrom, and (F) during an erase mode, control the positioning apparatus in positioning a given one of the heat probes proximate a first of the one or more indentations, and (G) during the erase mode, cause the given one of the heat probes to heat the storage medium to or near its melting point so that the first indentation in the storage medium is removed and the data is erased.

8. The data storage device of claim 7 wherein the plurality of heat probes use the same tips as the plurality of probes.

9. The data storage device of claim 7 wherein the plurality of heat probes use different tips than the plurality of probes.

10. The data storage device of claim 7 in which the storage components are operated in a vacuum.

11. The data storage device of claim 7 in which thestorage components are operated in an inert gas.

* * * * *